US011887812B2

(12) United States Patent
Nguyen et al.

(10) Patent No.: US 11,887,812 B2
(45) Date of Patent: Jan. 30, 2024

(54) BIAS SUPPLY WITH A SINGLE CONTROLLED SWITCH

(71) Applicant: Advanced Energy Industries, Inc., Fort Collins, CO (US)

(72) Inventors: Hien Minh Nguyen, Longmont, CO (US); Gideon Van Zyl, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 193 days.

(21) Appl. No.: 16/926,876

(22) Filed: Jul. 13, 2020

(65) Prior Publication Data

US 2021/0013006 A1 Jan. 14, 2021

Related U.S. Application Data

(60) Provisional application No. 62/873,680, filed on Jul. 12, 2019.

(51) Int. Cl.
*H01J 37/32* (2006.01)
*H01L 21/67* (2006.01)

(52) U.S. Cl.
CPC .. *H01J 37/32128* (2013.01); *H01L 21/67069* (2013.01); *H01J 2237/327* (2013.01)

(58) Field of Classification Search
CPC .......... H01J 37/32128; H01J 2237/327; H01L 21/67069
See application file for complete search history.

(56) References Cited

U.S. PATENT DOCUMENTS

| | | | |
|---|---|---|---|
| 4,622,094 A | 11/1986 | Otsubo | |
| 4,693,805 A | 9/1987 | Quazi | |
| 4,891,118 A | 1/1990 | Ooiwa et al. | |
| 4,963,239 A | 10/1990 | Fujita et al. | |

(Continued)

FOREIGN PATENT DOCUMENTS

| | | |
|---|---|---|
| CN | 1451172 | 10/2003 |
| CN | 1839459 | 9/2006 |

(Continued)

OTHER PUBLICATIONS

International Preliminary Report on Patentability Chapter I received for International PCT Application Serial No. PCT/US2020/041771 dated Jan. 27, 2022, 10 pages.

(Continued)

*Primary Examiner* — Yuechuan Yu
(74) *Attorney, Agent, or Firm* — Neugeboren O'Dowd PC

(57) ABSTRACT

Bias supplies, plasma processing systems, and associated methods are disclosed. One bias supply comprises a first inductor coupled between a first node of a switch and an output node where a first node of a second inductor is coupled to one of the output node or the first node of the switch. A voltage source is coupled between a second node of the switch and a second node of the second inductor. A connection is made between the return node and one of the second node of the switch and the second node of the second inductor. The bias supply also comprises a controller configured to cause an application of the periodic voltage between the output node and the return node by repeatedly closing the switch so current through the switch completes a full cycle.

3 Claims, 18 Drawing Sheets

(56) References Cited

U.S. PATENT DOCUMENTS

| | | |
|---|---|---|
| 5,057,185 A | 10/1991 | Singh et al. |
| 5,156,703 A | 10/1992 | Oechsner |
| 5,160,397 A | 11/1992 | Doki et al. |
| 5,242,561 A | 9/1993 | Sato |
| 5,415,718 A | 5/1995 | Ohmi et al. |
| 5,427,669 A | 6/1995 | Drummond |
| 5,487,785 A | 1/1996 | Horiike et al. |
| 5,535,906 A | 7/1996 | Drummond |
| 5,770,972 A | 6/1998 | Collier et al. |
| 5,859,428 A | 1/1999 | Fruchtman |
| 5,983,828 A | 11/1999 | Savas |
| 6,030,667 A | 2/2000 | Nakagawa et al. |
| 6,051,114 A | 4/2000 | Yao et al. |
| 6,110,287 A | 8/2000 | Arai et al. |
| 6,129,806 A | 10/2000 | Kaji et al. |
| 6,156,667 A | 12/2000 | Jewett |
| 6,162,709 A | 12/2000 | Raoux et al. |
| 6,201,208 B1 | 3/2001 | Wendt et al. |
| 6,291,938 B1 | 9/2001 | Jewett et al. |
| 6,313,583 B1 | 11/2001 | Arita et al. |
| 6,326,584 B1 | 12/2001 | Jewett et al. |
| 6,392,210 B1 | 5/2002 | Jewett et al. |
| 6,478,924 B1 | 11/2002 | Shamouilian et al. |
| 6,507,155 B1 | 1/2003 | Barnes et al. |
| 6,544,895 B1 | 4/2003 | Donohoe |
| 6,568,346 B2 | 5/2003 | Pu et al. |
| 6,583,572 B2 | 6/2003 | Veltrop et al. |
| 6,617,794 B2 | 9/2003 | Barnes et al. |
| 6,621,674 B1 | 9/2003 | Zahringer et al. |
| 6,646,385 B2 | 11/2003 | Howald et al. |
| 6,685,798 B1 | 2/2004 | Howald et al. |
| 6,694,915 B1 | 2/2004 | Howald et al. |
| 6,707,051 B2 | 3/2004 | Shun'ko |
| 6,714,033 B1 | 3/2004 | Makhratchev et al. |
| 6,724,148 B1 | 4/2004 | Gonzalez et al. |
| 6,777,037 B2 | 8/2004 | Sumiya et al. |
| 6,794,301 B2 | 9/2004 | Savas |
| 6,819,096 B2 | 11/2004 | Gonzalez et al. |
| 6,822,396 B2 | 11/2004 | Gonzalez et al. |
| 6,863,018 B2 | 3/2005 | Koizumi et al. |
| 6,872,289 B2 | 3/2005 | Mizuno et al. |
| 6,885,153 B2 | 4/2005 | Quon |
| 6,885,453 B2 | 4/2005 | Kaumann |
| 6,913,938 B2 | 7/2005 | Shanmugasundram et al. |
| 6,920,312 B1 | 7/2005 | Benjamin |
| 6,927,358 B2 | 8/2005 | Gonzalez et al. |
| 6,946,063 B1 | 9/2005 | Gonzalez et al. |
| 6,984,198 B2 | 1/2006 | Krishnamurthy et al. |
| 7,005,845 B1 | 2/2006 | Gonzalez et al. |
| 7,046,524 B2 | 5/2006 | Hoffman et al. |
| 7,059,267 B2 | 6/2006 | Hedberg et al. |
| 7,132,618 B2 | 11/2006 | Hoffman et al. |
| 7,201,936 B2 | 4/2007 | Schwarm et al. |
| 7,245,084 B1 | 7/2007 | Gonzalez et al. |
| 7,253,117 B2 | 8/2007 | Donohoe |
| 7,297,637 B2 | 11/2007 | Hedberg et al. |
| 7,373,899 B2 | 5/2008 | Sumiya et al. |
| 7,468,494 B2 | 12/2008 | Gonzalez et al. |
| 7,520,956 B2 | 4/2009 | Samukawa et al. |
| 7,528,386 B2 | 5/2009 | Ruzic et al. |
| 7,645,357 B2 | 1/2010 | Paterson et al. |
| 7,725,208 B2 | 5/2010 | Shanmugasundram et al. |
| 7,737,702 B2 | 6/2010 | Pipitone |
| 7,764,140 B2 | 7/2010 | Nagarkatti et al. |
| 7,777,179 B2 | 8/2010 | Chen et al. |
| 7,783,375 B2 | 8/2010 | Shanmugasundram et al. |
| 7,847,247 B2 | 12/2010 | Denpoh |
| 8,140,292 B2 | 3/2012 | Wendt |
| 8,169,595 B2 | 5/2012 | Schriever et al. |
| 8,329,054 B2 | 12/2012 | Ichino et al. |
| 8,404,598 B2 | 3/2013 | Liao et al. |
| 8,409,398 B2 | 4/2013 | Brcka |
| 8,475,673 B2 | 7/2013 | Edelberg |
| 8,641,916 B2 | 2/2014 | Yatsuda et al. |
| 8,698,107 B2 | 4/2014 | Godet et al. |
| 8,900,402 B2 | 12/2014 | Holland et al. |
| 9,105,447 B2 | 8/2015 | Brouk et al. |
| 9,114,666 B2 | 8/2015 | Valcore, Jr. et al. |
| 9,123,509 B2 | 9/2015 | Papasouliotis et al. |
| 9,177,756 B2 | 11/2015 | Holland et al. |
| 9,210,790 B2 | 12/2015 | Hoffman et al. |
| 9,283,635 B2 | 3/2016 | Peters |
| 9,305,803 B2 | 4/2016 | Morimoto et al. |
| 9,378,931 B2 | 6/2016 | Kwon et al. |
| 9,390,893 B2 | 7/2016 | Valcore, Jr. et al. |
| 9,536,749 B2 | 1/2017 | Marakhtanov et al. |
| 9,593,421 B2 | 3/2017 | Baek et al. |
| 9,595,424 B2 | 3/2017 | Marakhtanov et al. |
| 9,604,877 B2 | 3/2017 | Veerasamy et al. |
| 9,685,297 B2 | 6/2017 | Carter et al. |
| 9,754,767 B2 | 9/2017 | Kawasaki |
| 9,754,768 B2 | 9/2017 | Yamada et al. |
| 9,761,414 B2 | 9/2017 | Marakhtanov et al. |
| 9,761,419 B2 | 9/2017 | Nagami |
| 9,767,988 B2 | 9/2017 | Brouk et al. |
| 9,788,405 B2 | 10/2017 | Kawasaki et al. |
| 9,818,584 B2 | 11/2017 | Miller et al. |
| 9,872,373 B1 | 1/2018 | Shimizu et al. |
| 9,892,888 B2 | 2/2018 | Baek et al. |
| 10,448,494 B1 | 10/2019 | Dorf et al. |
| 10,448,495 B1 | 10/2019 | Dorf et al. |
| 10,607,813 B2 | 3/2020 | Fairbairn et al. |
| 10,707,055 B2 | 7/2020 | Shaw et al. |
| 10,791,617 B2 | 9/2020 | Dorf et al. |
| 10,811,228 B2 | 10/2020 | Van Zyl et al. |
| 11,189,454 B2 | 11/2021 | Carter et al. |
| 11,284,500 B2 | 3/2022 | Griffin et al. |
| 11,437,221 B2 | 9/2022 | Carter et al. |
| 2001/0014540 A1 | 8/2001 | Shan et al. |
| 2002/0038631 A1 | 4/2002 | Sumiya et al. |
| 2002/0115301 A1 | 8/2002 | Savas |
| 2002/0144786 A1 | 10/2002 | Chiang et al. |
| 2003/0033116 A1 | 2/2003 | Brcka et al. |
| 2004/0007326 A1 | 1/2004 | Roche et al. |
| 2004/0094402 A1 | 5/2004 | Gopalraja et al. |
| 2005/0090118 A1 | 4/2005 | Shannon et al. |
| 2005/0260354 A1 | 11/2005 | Singh et al. |
| 2006/0088655 A1 | 4/2006 | Collins et al. |
| 2006/0130971 A1 | 6/2006 | Chang et al. |
| 2006/0171093 A1 | 8/2006 | Ishimura et al. |
| 2006/0226786 A1 | 10/2006 | Lin et al. |
| 2007/0186856 A1 | 8/2007 | Yasui et al. |
| 2007/0193975 A1 | 8/2007 | Wilson |
| 2007/0246163 A1 | 10/2007 | Paterson et al. |
| 2008/0135400 A1 | 6/2008 | Kadlec et al. |
| 2009/0077150 A1 | 3/2009 | Wendt |
| 2009/0200494 A1 | 8/2009 | Hatem et al. |
| 2009/0255800 A1 | 10/2009 | Koshimizu |
| 2009/0298287 A1 | 12/2009 | Shannon et al. |
| 2010/0072172 A1 | 3/2010 | Ui et al. |
| 2010/0154994 A1 | 6/2010 | Fischer et al. |
| 2010/0208409 A1 | 8/2010 | Bluck et al. |
| 2010/0276273 A1 | 11/2010 | Heckman et al. |
| 2010/0296977 A1 | 11/2010 | Hancock |
| 2011/0031217 A1 | 2/2011 | Himori |
| 2011/0038187 A1 | 2/2011 | Horishita et al. |
| 2011/0065161 A1 | 3/2011 | Kwasinski et al. |
| 2011/0089023 A1 | 4/2011 | Tanaka et al. |
| 2011/0095689 A1 | 4/2011 | Gilbert |
| 2011/0220491 A1 | 9/2011 | Hilliard |
| 2011/0223750 A1 | 9/2011 | Hayashi et al. |
| 2011/0226617 A1 | 9/2011 | Hofmann et al. |
| 2011/0248634 A1 | 10/2011 | Heil et al. |
| 2011/0259851 A1 | 10/2011 | Brouk et al. |
| 2012/0052599 A1 | 3/2012 | Brouk et al. |
| 2012/0052689 A1 | 3/2012 | Tokashiki |
| 2012/0187844 A1 | 7/2012 | Brouk et al. |
| 2012/0217221 A1 | 8/2012 | Hoffman et al. |
| 2012/0318456 A1 | 12/2012 | Brouk et al. |
| 2012/0319584 A1 | 12/2012 | Brouk et al. |
| 2013/0122711 A1 | 5/2013 | Marakhtanov et al. |
| 2014/0061156 A1 | 3/2014 | Brouk et al. |
| 2014/0062303 A1 | 3/2014 | Hoffman et al. |
| 2014/0062495 A1 | 3/2014 | Carter et al. |

(56) References Cited

U.S. PATENT DOCUMENTS

| | | | |
|---|---|---|---|
| 2014/0117861 A1* | 5/2014 | Finley | H05H 1/48 315/172 |
| 2014/0148016 A1 | 5/2014 | Kanazawa et al. | |
| 2014/0173158 A1 | 6/2014 | Valcore, Jr. | |
| 2014/0265910 A1 | 9/2014 | Kobayashi et al. | |
| 2014/0302682 A1 | 10/2014 | Muto et al. | |
| 2014/0305905 A1 | 10/2014 | Yamada et al. | |
| 2015/0076112 A1 | 3/2015 | Sriraman et al. | |
| 2015/0126037 A1 | 5/2015 | Chen et al. | |
| 2015/0315698 A1 | 11/2015 | Chistyakov | |
| 2015/0325413 A1 | 11/2015 | Kim et al. | |
| 2015/0371827 A1 | 12/2015 | Godet et al. | |
| 2016/0020108 A1 | 1/2016 | Ranjan et al. | |
| 2016/0027616 A1 | 1/2016 | Ramaswamy et al. | |
| 2016/0056017 A1 | 2/2016 | Kim et al. | |
| 2016/0064247 A1 | 3/2016 | Tomura et al. | |
| 2016/0079037 A1 | 3/2016 | Hirano et al. | |
| 2016/0126068 A1 | 5/2016 | Lee et al. | |
| 2016/0126069 A1 | 5/2016 | Kwon et al. | |
| 2016/0240353 A1 | 8/2016 | Nagami | |
| 2016/0351375 A1 | 12/2016 | Valcore, Jr. et al. | |
| 2017/0018411 A1 | 1/2017 | Sriraman et al. | |
| 2017/0029941 A1 | 2/2017 | Allen et al. | |
| 2017/0053820 A1 | 2/2017 | Bosch et al. | |
| 2017/0099723 A1 | 4/2017 | Nagami et al. | |
| 2017/0154781 A1 | 6/2017 | Ranjan et al. | |
| 2017/0278665 A1 | 9/2017 | Carter et al. | |
| 2018/0082824 A1 | 3/2018 | Likhanskii et al. | |
| 2018/0226225 A1 | 8/2018 | Koh et al. | |
| 2018/0342903 A1 | 11/2018 | Luu et al. | |
| 2019/0066979 A1 | 2/2019 | Shoeb et al. | |
| 2019/0157043 A1* | 5/2019 | Shaw | H01J 37/32174 |
| 2019/0180982 A1 | 6/2019 | Brouk et al. | |
| 2020/0090905 A1 | 3/2020 | Brouk et al. | |
| 2021/0005428 A1 | 1/2021 | Shaw et al. | |
| 2021/0013006 A1 | 1/2021 | Nguyen et al. | |
| 2021/0074513 A1 | 3/2021 | Van Zyl et al. | |
| 2021/0134562 A1 | 5/2021 | Fairbairn et al. | |
| 2021/0202209 A1 | 7/2021 | Van Zyl et al. | |
| 2021/0241996 A1 | 8/2021 | Carter et al. | |
| 2021/0327679 A1 | 10/2021 | Carter et al. | |
| 2021/0351007 A1 | 11/2021 | Carter | |

FOREIGN PATENT DOCUMENTS

| | | |
|---|---|---|
| CN | 101685772 A | 3/2010 |
| CN | 201465987 U | 5/2010 |
| CN | 101835334 A | 9/2010 |
| CN | 102217045 A | 10/2011 |
| CN | 102405512 A | 4/2012 |
| CN | 105097404 A | 11/2015 |
| CN | 106920729 A | 7/2017 |
| EP | 0383570 A2 | 8/1990 |
| EP | 1978542 A1 | 10/2008 |
| EP | 1129481 B1 | 2/2012 |
| GB | 2382459 A | 5/2003 |
| GB | 2400613 A | 10/2004 |
| JP | 60-126832 | 7/1985 |
| JP | 62125626 A | 6/1987 |
| JP | 0214572 A | 5/1990 |
| JP | 04-193329 A | 7/1992 |
| JP | 09293600 | 11/1997 |
| JP | 2004193564 A | 7/2004 |
| JP | 2006-147269 A | 6/2006 |
| JP | 200971133 A | 4/2009 |
| JP | 2009-540569 A | 11/2009 |
| JP | 2010103465 A | 5/2010 |
| JP | 2010238960 A | 10/2010 |
| JP | 2012-104382 A | 5/2012 |
| KR | 1020120019428 A | 3/2012 |
| TW | 200811905 A | 3/2008 |
| TW | 200915375 A | 4/2009 |
| TW | 201142068 A | 12/2011 |
| TW | 201614097 A | 4/2016 |
| TW | 201621974 A | 6/2016 |
| TW | 201637069 A | 10/2016 |
| WO | 0215222 A2 | 2/2002 |
| WO | 2010013476 A1 | 2/2010 |
| WO | 2010080421 A1 | 7/2010 |
| WO | 2010126893 A2 | 11/2010 |
| WO | 2012030500 A1 | 3/2012 |
| WO | 2012103101 A1 | 8/2012 |
| WO | 2013016619 | 1/2013 |
| WO | 2014035889 A1 | 3/2014 |
| WO | 2017126184 A1 | 7/2017 |

OTHER PUBLICATIONS

Non-Final Office Action received for U.S. Appl. No. 16/278,822 dated Aug. 2, 2021, 11 pages.
Non-Final Office Action received for U.S. Appl. No. 17/150,633 dated Nov. 24, 2021, 52 pages.
Non-Final Office Action received for U.S. Appl. No. 17/171,164 dated Oct. 15, 2021, 60 pages.
Abraham, Ibrahime A., "United States Office Action Re U.S. Appl. No. 12/767,775", dated Dec. 15, 2014, p. 37, Published in: US.
Brayton, John Joseph, "United States Office Action Re U.S. Appl. No. 13/193,345", dated Jan. 15, 2016, p. 33, Published in: US.
Mitrovic, Bayer, "International Search Report and Written Report Re Application No. PCT/US2011/047467", dated Feb. 12, 2011, p. 9, Published in: AU.
Guinea, William, "International Search Report and Written Opinion Re Application No. PCT/US2012/048504", dated Sep. 12, 2012, p. 4, Published in: AU.
Alejandro Mulero, Luz L, "Office Action Regarding U.S. Appl. No. 14/803,815", dated Jul. 3, 2018, p. 67, Published in: US.
Alejandro Mulero, Luz, "Office Action Regarding U.S. Appl. No. 14/803,815", dated Nov. 17, 2017, p. 8, Published in: US.
Daimon, Kiyoshi, "Office Action Regarding Japanese Patent Application No. 2018-138425", dated May 22, 2019, p. 10, Published in: JP.
Korean Patent Office, "Notice of Grounds for Rejection Regarding Korean Patent Application No. 10-2018-7029468", Feb. 7, 2019, p. 6, Published in: KR.
Yukari Nakamura, "International Preliminary Report on Patentability Regarding International Application No. PCT/US2018/061653", dated May 28, 2020, p. 9, Published in: CH.
Choi, Sang Won, "International Search Report and Written Opinion Regarding International Application No. PCT/US2018/061653", dated Mar. 8, 2019, p. 12 Published in: KR.
Luque, Renan, "Office Action Regarding U.S. Appl. No. 16/194,104", dated Aug. 1, 2019, p. 84 Published in: US.
Luque, Renan, "Office Action Regarding U.S. Appl. No. 16/803,020", dated Apr. 22, 2020, p. 36 Published in: US.
Athina Nickitas-Etienne, "International Preliminary Report on Patentability Regarding International Application No. PCT/US2018/061575", dated May 28, 2020, p. 9 Published in: CH.
Choi, Sang Won, "The International Search Report and the Written Opinion Re International Application No. PCT/US2018/061575", dated Mar. 6, 2019, p. 14 Published in: WO.
TIPO, "Office Action Regarding Taiwan Patent Application No. 107140926", dated May 28, 2020, p. 12 Published in: TW.
Luque, Renan, "Office Action Regarding U.S. Appl. No. 16/193,790", dated Sep. 4, 2019, p. 230, Published in: US.
Hammond, Crystal, "Office Action Regarding U.S. Appl. No. 16/246,996", dated Dec. 12, 2019, p. 84 Published in: US.
Simin Baharlou, "International Preliminary Report on Patentability for International Application No. PCT/ US2018/061671", dated May 28, 2020, p. 14 Published in: CH.
Choi, Sang Won, "International Search Report and Written Opinion Regarding International Application No. PCT/US2018/061671", dated Mar. 13, 2019, p. 17 Published in: KR.
TIPO, "Office Action Regarding Taiwan Patent Application No. 107140924", dated Apr. 28, 2020, p. 9 Published in: TW.
Hammond, Crystal, "Office Action Regarding U.S. Appl. No. 16/194,125", dated Dec. 12, 2019, p. 88 Published in: US.

(56) References Cited

OTHER PUBLICATIONS

Hammond, Crystal, "Office Action Regarding U.S. Appl. No. 16/270,391", dated Dec. 12, 2019, p. 78 Published in: US.
Buzzi, F.L., et al., "Energy Distribution of Bombarding Ions in Plasma Etching of Dielectrics", "AVS 54th International Symposium", Oct. 15, 2007, Publisher Univ. of Wisconsin—Madison, Published in: US.
Bryns, B., et al., "A VHF driven coaxial atmospheric air plasma: electrical and optical characterization", Dec. 16, 2011, pp. 118, No. Rev. 2-0, Publisher N. C. ST. U., Dep't of Nuclear Engr., Published in: US.
SIPO, "Chinese Office Action re Application No. 201180046783.1", dated Mar. 24, 2015, p. 18 Published in: CN.
SIPO, "Chinese Office Action re Application No. 201080003206. X", dated May 23, 2014, p. 6 Published in: CN.
Yafeng, Zhang, "Chinese Office Action re Application No. 201080003206.X", dated Jun. 10, 2015, p. 8 Published in: CN.
Yafeng, "Chinese Office Action re Application No. 201080003206. X", dated Sep. 4, 2013, p. 15 Published in: CN.
Yafeng, Zhang, "Chinese Office Action re Application No. 201080003206.X", dated Nov. 26, 2014, p. 6 Published in: CN.
Kudelka, Stephan, "Supplementary European Search Report re EP Application 10 77 0205.2, PCT/US2010/032582", dated Jan. 30, 2013, p. 8 Published in: NL.
Emsellem, G., "Electrodeless Plasma Thruster Design Characteristics", Jul. 11, 2005, p. 22 Publisher: 41st Joint Propulsion Conference, Tucson, Published in: US.
George, M.A., et al., "Silicon Nitride Arc Thin Films by New Plasma Enhanced Chemical Vapor Deposition Source Technology", Jul. 7, 2011, p. 5 Publisher: Article downloaded from www.generalplasma.com, Published in: US.
Masaaki Awano, "Japanese Office Action re Application No. 2012-508593", dated Apr. 19, 2013, p. 11 Published in: JP.
Moku, Tetsuji, "Japanese Office Action re Application No. 2013-527088", dated Apr. 21, 2015, p. 10 Published in: JP.
Moku, Tetsuji, "Japanese Office Action re Application No. 2014-523-057", dated Apr. 21, 2015, p. 11 Published in: JP.
Duk Yeul Baek, "Korean Office Action re Applcation No. 10-2011-7009075", dated Mar. 25, 2013, p. 2 Published in: KR.
The Korean Intellectual Property Office, "Korean Office Action re Application No. 10-2013-7007594", dated Jul. 28, 2014, p. 2 Published in: KR.
Krolak, M, "Matthew Krolak's MyElectricEngine.Com Megnetoplasmadynamic (MPD) Thruster Design", Apr. 28, 2011, p. 7 Publisher: Webpage downloaded from http://myelectricengine.com/projects/mpdthruster/mpdthruster.html, Published in: US.
Brayton, John Joseph, "US Office Action re U.S. Appl. No. 13/597093", dated Nov. 5, 2015, p. 76 Published in: US.
Brayton, John Joseph, "Office Action re U.S. Appl. No. 14/606,857", dated Apr. 8, 2015, p. 51 Published in: US.
Sathiraju, Srinivas, "Office Action re U.S. Appl. No. 13/597,032", dated Apr. 9, 2015, p. 32 Published in: US.
Sathiraju, Srinivas, "Office Action re U.S. Appl. No. 13/597,032", dated Jun. 20, 2014, p. 42 Published in: US.
Brayton, John Joseph, "Office Action re U.S. Appl. No. 13/597,050", dated Jul. 17, 2015, p. 86 Published in: US.
Shamim, Ahmed, "Office Action re U.S. Appl. No. 14/011,305", dated Dec. 4, 2014, p. 28 Published in: US.
Atkinson, Gerard, "International Search Report and Written Opinion re Application No. PCT/US10/032582", dated Feb. 2011, Published in: AU.
Lindner, Nora, "International Preliminary Report on Patentability re Application PCT/US2010/032582", dated Nov. 1, 2011, p. 8 Published in: CH.
Baharlou, Simin, "International Preliminary Report on Patentability re Application No. PCT/US2011/047467", dated Mar. 14, 2013, p. 7 Published in: CH.
Rabbani, Firoozeh, "International Search Report and Written Opinion Re Application No. PCT/US2012/022380", dated Mar. 13, 2012, Published in: AU.

Devlin, Martin, "International Search Report and Written Opinion Re Application No. PCT/US2012/029953", dated May 24, 2012, p. 11 Published in: AU.
Baharlou, Simin, "International Preliminary Report on Patentability re Application No. PCT/US2012/048504", dated Feb. 6, 2014, p. 11 Published in: CH.
European Patent Office, "Office Action Regarding Application No. 11822326.2", dated Oct. 18, 2018, p. 6, Published in: EU.
SIPO, "Office Action Regarding Chinese Application No. 201711336133.6", dated Jan. 6, 2020, p. 7, Published in: CN.
SIPO, "Office Action Regarding Chinese Patent Application No. 201711336133.6", dated Mar. 4, 2019, p. 16, Published in: CN.
Fujimoto, Kayoko, "Office Action Regarding Japanese Patent Application No. 2018-081644", dated Apr. 16, 2019, p. 21, Published in: JP.
Joo-Seung Kim, "The Korean Intellecutal Propery Office Notice of Grounds for Rejection Regarding Korean Patent Application No. 10-2015-7007771", dated May 31, 2018, p. 6, Published in: KR.
European Patent Office, "Office Action Regarding European Patent Application No. 10 770 205.2", dated Oct. 22, 2019, p. 6, Published in: EU.
Brayton, John Joseph, "United States Office Action Re U.S. Appl. No. 12/870,837", dated Jan. 9, 2015, p. 40, Published in: US.
Brayton, John Joseph, "United States Office Action Re U.S. Appl. No. 12/870,837", dated Dec. 19, 2012, p. 8, Published in: US.
Brayton, John Joseph, "United States Office Action Re U.S. Appl. No. 12/870,837", dated Dec. 20, 2013, p. 33, Published in: US.
SIPO, "Chinese Office Action re Application No. 201180046783.1", dated May 17, 2016, p. 8, Published in: CN.
SIPO, "Chinese Office Action Re Application No. 201180046783. 1", dated Dec. 7, 2016, p. 9, Published in: CN.
SIPO, "Office Action Re Chinese Application No. 201180046783. 1", dated Dec. 8, 2015, p. 9, Published in: CN.
European Patent Office, "European Office Action Re Application No. 11822326.2", dated Apr. 3, 2017, p. 4, Published in: EP.
Claessen, Michiel, "European Office Action Re Application No. 11822326.2", dated Feb. 27, 2018, p. 5, Published in: EP.
Aguilar, Maria, "Supplementary Partial European Search Report Re Application No. EP11822326", dated Oct. 16, 2015, p. 5, Published in: EP.
Suzuki, Soichiro, "Japanese Office Action Re Application No. 2016-043215", dated Jan. 25, 2017, p. 7, Published in: JP.
The Korean Intellectual Property Office, "Korean Office Action re Application No. 10-2014-7004544", dated Feb. 3, 2016, p. 13, Published in: KR.
Brayton, John Joseph, "United States Office Action Re U.S. Appl. No. 13/193,299", dated May 21, 2015, p. 24, Published in: US.
Brayton, John Joseph, "United States Office Action Re U.S. Appl. No. 13/193,299", dated Sep. 26, 2014, p. 37, Published in: US.
Brayton, John Joseph, "United States Office Action Re U.S. Appl. No. 13/193,299", dated Dec. 4, 2015, p. 30, Published in: US.
Brayton, John Joseph, "United States Office Action Re U.S. Appl. No. 13/193,299", dated Dec. 18, 2013, p. 43, Published in: US.
SIPO, "Chinese Office Action re Application No. 201280047162. X", dated Apr. 26, 2016, p. 7, Published in: CN.
SIPO, "Chinese Office Action Re Application No. 201280047162. X", dated Oct. 24, 2016, p. 31, Published in: CN.
SIPO, "Chinese Office Action Re Application No. 201280047162. X", dated Sep. 6, 2015, p. 18, Published in: CN.
Brayton, John Joseph, "United States Office Action Re U.S. Appl. No. 13/193,345", dated Apr. 16, 2015, p. 34, Published in: US.
Brayton, John Joseph, "United States Office Action Re U.S. Appl. No. 13/193,345", dated Jul. 7, 2014, p. 26, Published in: US.
Brayton. John Joseph, "United States Office Action Re U.S. Appl. No. 13/193,345", dated Nov. 7, 2013, p. 36, Published in: US.
Brayton, John Joseph, "United States Office Action Re U.S. Appl. No. 13/596,976", dated Jul. 1, 2016, p. 35, Published in: US.
Brayton, John Joseph, "United States Office Action Re U.S. Appl. No. 13/596,976", dated Nov. 6, 2015, p. 77, Published in: US.
Brayton, John Joseph, "United States Office Action Re U.S. Appl. No. 13/596,976", dated Nov. 25, 2016, p. 21, Published in: US.
SIPO, "Chinese Office Action Re Application No. 201380056068. 5", dated Oct. 17, 2016, p. 15, Published in: CN.

(56) References Cited

OTHER PUBLICATIONS

SIPO, "Chinese Office Action Re Application No. 201380056068. 5", dated Jun. 12, 2017, p. 16, Published in: CN.
Brayton, John Joseph, "United States Office Action Re U.S. Appl. No. 13/596,976", dated Apr. 5, 2017, p. 24, Published in: US.
Fujimoto, Kayoko, "Japanese Office Action Re Application No. 2015-529905", dated Aug. 22, 2017, p. 16, Published in: JP.
Fujimoto, Kayoko, "Japanese Office Action Re Appl. No. 2015-529905", dated Aug. 24, 2017, p. 16, Published in: Japan.
Kim, Joo-Seung, "Korean Office Action Re Application No. 10-2015-7007273", dated Jan. 30, 2018, p. 8, Published in: KR.
SIPO, "Chinese Office Action Re Application No. 201380056070. 2", dated Aug. 15, 2016, p. 25, Published in: CN.
Brayton, John Joseph, "United States Office Action Re U.S. Appl. No. 13/597,050", dated Mar. 10, 2016, p. 20, Published in: US.
SIPO, "Chinese Office Action Issued for Application No. 201380056070. 2", dated Apr. 2, 2018, p. 6, Published in: CN.
SIPO, "Chinese Office Action Re Application No. 201380056070. 2", dated Jul. 11, 2017, p. 13, Published in: CN.
Suzuki, Soichiro, "Japanese Office Action Re Application No. 2015-529906", dated May 16, 2017, p. 13, Published in: JP.
Kudelka, Stephan, "European Office Action Re Appl. No. 10 770 205.2", dated Nov. 2, 2017, p. 30, Published in: EPO.
Awano, Masaaki, "Japanese Office Action Re Application No. 2012-508593", dated Sep. 6, 2013, p. 7, Published in: JP.
Atkinson, Gerard, "International Search Report and Written Opinion Re Application No. PCT/US2010/032582", dated Feb. 21, 2011, p. 10, Published in: AU.
Taiwan Patent Office, "Taiwan Office Action Re Application No. 099113815", dated Jan. 12, 2014, p. 9, Published in: TW.
Abraham, Ibrahime A., "United States Office Action Re U.S. Appl. No. 12/767,775", dated Apr. 25, 2013, p. 28, Published in: US.
Abraham, Ibrahime A., "United States Office Action Re U.S. Appl. No. 12/767,775", dated Jun. 17, 2015, p. 28, Published in: US.
Abraham, Ibrahime A., "United States Office Action Re U.S. Appl. No. 12/767,775", dated Jul. 1, 2014, p. 48, Published in: US.
Abraham, Ibrahime A., "United States Office Action Re U.S. Appl. No. 12/767,775", dated Sep. 10, 2013, p. 30, Published in: US.
McLeod, Austin, "United States Office Action Re U.S. Appl. No. 12/767,775", dated Oct. 17, 2012, p. 33, Published in: US.
Brayton, John Joseph, "Office Action Regarding U.S. Appl. No. 15/667,239", dated Jun. 24, 2020, p. 131 Published in: US.
CNIPA, "Notification of the 3rd Office Action Issued in Application No. 201711336133.6", dated Oct. 10, 2020, p. 21 Published in: CN.
Kudelka, Stephan, "Communication Pursuant to Article 94(3) EPC Issued in Application No. 10 770 205.2", dated Oct. 23, 2020, p. 4, Published in: EP.
Brayton, John Joseph, "Office Action Regarding U.S. Appl. No. 15/495,513", dated Jul. 2, 2020, p. 87 Published in: US.
Taiwan Patent Office, "Office Action Regarding Application No. 107140924", dated Jan. 15, 2021, p. 12 Published in: TW.
Jeon, M., et al., "Hydrogenated amorphous silicon film as intrinsic passivation layer deposited at various temperatures using RF remo . . . ", "Current Applied Physics", Nov. 12, 2009, pp. S237-S240, vol. 10, No. (2010), Publisher: Elsevier B.V., Published in: US.
Bruno, G., et al., "Real time ellipsometry for monitoring plasma-assisted epitaxial growth of GaN", "Applied Surface Sci.", Jul. 7, 2006, pp. 219-223, vol. 253, No. (2006), Publisher: Elsevier B.V., Published in: US.
Giangregorio, M.M., et al., "Role of plasma activation in tailoring the nanostructure of multifunctional oxides thin films", "Applied Surface Sci.", Sep. 10, 2008, pp. 5396-5400, vol. 255, No. (2009), Publisher: Elsevier B.V., Published in: US.
Vahedi, V., et al., "Verification of frequency scaling laws for capacitive radio-frequency discharges using two-dimensional simulations", "Phys. Fluids B", Jul. 1993, pp. 2719-2729, vol. 5, No. 7, Publisher: Am. Inst. of Physics, Published in: US.
Rauf, S., et al., "Nonlinear Dynamics of Radio Frequency Plasma Processing Reactors Powered by Multifrequency Sources", "IEEE Transactions on Plasma Science", Oct. 5, 1999, pp. 1329-1338, vol. 27, No. 5, Publisher: IEEE.
Raoux, S., et al., "Remote microwave plasma source for cleaning chemical vapor deposition chambers; Technology for reducing global warm . . . ", "J. Vac. Sci. Technol. B Mar./Apr. 1999", 1999, pp. 477-485, vol. 17, No. 2, Publisher: Am. Vacuum Soc'y, Published in: US.
Gangoli, S.P., et al., "Production and transport chemistry of atomic fluorine in remote plasma source and cylindrical reaction chamber", "J. Phys. D: Appl. Phys.", Aug. 16, 2007, pp. 5140-5154, vol. 40, No. (2007), Publisher: IOP Publishing Ltd., Published in: UK.
Yun, Y.B., et al., "Effects of various additive gases on chemical dry etching rate enhancement of low-k SiOCH layer in F2/Ar remote plasmas", "Thin Solid Films", Aug. 15, 2007, pp. 3549-3553, vol. 516, No. (2008), Publisher: Elsevier B.V., Published in: US.
Kuo, M.S., et al., "Influence of C4F8/Ar-based etching and H2-based remote plasma ashing processes on ultralow k materials modifications", "J. Vac. Sci. Technol. B, Mar./Apr. 2010", Mar. 19, 2010, pp. 284-294, vol. 28, No. 2, Publisher: Am. Vacuum Soc'y, Published in: US.
Heil, S.B.S., et al., "Deposition of TiN and HfO2 in a commercial 200 mm plasma atomic layer deposition reactor", "J. Vac. Sci. Technol. A, Sep./Oct. 2007", Jul. 31, 2007, pp. 1357-1366, vol. 25, No. 5, Publisher: Am. Vacuum Soc'y, Published in: US.
Kim, J.Y., et al., "Remote plasma enhanced atomic layer deposition of TiN thin films using metalorganic precursor", "J. Vac. Sci. Technol. A, Jan./Feb. 2004", Nov. 13, 2003, pp. 8-12, vol. 22, No. 1, Publisher: Am. Vacuum Soc'y, Published in: US.
Wakeham, S.J., et al., "Low temperature remote plasma sputtering of indium tin oxide for flexible display applications", "Thin Solid Films", May 12, 2009, pp. 1355-1358, vol. 519, No. (2009), Publisher: Elsevier B.V.
Ohachi, T., et al., "Measurement of nitrogen atomic flux for RF-MBE growth of GaN and AlN on Si substrates", "J. of Crystal Growth", Jan. 20, 2009, pp. 2987-2991, vol. 311, No. (2009), Publisher: Elsevier B.V.
Honda, S., et al., "Hydrogenation of polycrystalline silicon thin films", "Thin Solid Films", Oct. 5, 2005, pp. 144-148, vol. 501, No. (2006), Publisher: Elsevier B.V., Published in: US.
Brayton, John Joseph, "United States Office Action Re U.S. Appl. No. 12/870,837", dated Mar. 22, 2013, p. 46, Published in: US.
SIPO, "Office Action Regarding Chinese Patent Application No. 201710704712.5", dated Apr. 1, 2020, p. 7, Published in: CN.
SIPO, "Office Action Regarding Chinese Patent Application No. 201710704712.5", datedJan. 3, 2020, p. 8, Published in: CN.
SIPO, "Office Action Regarding Chinese Patent Application No. 201710704712.5", dated Feb. 22, 2019, p. 3, Published in: CN.
SIPO, "Office Action Regarding Chinese Patent Application 201710704712.5", dated Sep. 27, 2019, p. 11, Published in: CN.
EPO, "Extended European Search Report Regarding Patent Application No. 18877737.9", dated Aug. 25, 2021, p. 165, Published in: EP.
EPO, "Extended Search Report Regarding European Patent Appliication No. 18877322", dated Sep. 14, 2021, p. 129, Published in: EP.
EPO, "Extended European Search Report Regarding Patent Application No. 18878531.5", dated Sep. 1, 2021, p. 126, Published in: EP.
Harry Kim, "International Search Report and Wri I I Ln Opinion Regarding International Application No. PCT/US2020/027927", dated Sep. 17, 2021, p. 14, Published in: US.
Fujimoto, Kayoko, "Notice for Reasons of Rejection Regarding Japanese Patent Application No. 2020-081092", dated Apr. 1, 2021, p. 6, Published in: JP.
Kudeka, Stephan, "Communication Pursuant to Article 94(3) EPC Regarding Application No. 10 770 205.2", dated Jun. 8, 2021, p. 6, Published in: EU.
Brayton, John Joseph, "Office Action Regarding U.S. Appl. No. 15/495,513", dated Apr. 14, 2021, p. 10, Published in: US.
Luque, Renan, "Office Action Regarding U.S. Appl. No. 16/896,709", dated May 25, 2021, p. 36, Published in: US.

(56) References Cited

OTHER PUBLICATIONS

Hammond, Crystal, "Office Action Regarding U.S. Appl. No. 17/031,027", dated Apr. 28, 2021, p. 9, Punlished in: US.
Decision of Rejection received for Chinese Patent Application Serial No. 201710704712.5 dated Aug. 10, 2020, 8 pages.
Extended European Search Report received for European Patent Application Serial No. 18878531.5 dated Sep. 1, 2021, 126 pages.
Final Office Action received for U.S. Appl. No. 13/597,093 dated Jul. 8, 2016, 25 pages.
International Preliminary Report on Patentability received for International PCT Application Serial No. PCT/US2013/056634 dated Mar. 12, 2015, 7 pages.
International Preliminary Report on Patentability received for International PCT Application Serial No. PCT/US2013/056647 dated Mar. 12, 2015, 7 pages.
International Preliminary Report on Patentability received for International PCT Application Serial No. PCT/US2013/056657 dated Mar. 12, 2015, 8 pages.
International Preliminary Report on Patentability received for International PCT Application Serial No. PCT/US2013/056659 dated Mar. 12, 2015, 8 pages.
International Preliminary Report on Patentability received for International PCT Application Serial No. PCT/US2013/056851 dated Mar. 12, 2015, 8 pages.
International Preliminary Report On Patentability Received for International PCT Application Serial No. PCT/US2018/061653 dated May 28, 2020, 9 pages.
International Preliminary Report on Patentability received International Application Serial No. PCT/US2018/061575 dated May 28, 2020, 9 pages.
International Search Report and Written Opinion received for International PCT Application Serial No. PCT/US2013/056647 dated Oct. 30, 2013, 10 pages.
International Search Report and Written Opinion received for International PCT Application Serial No. PCT/US2013/056657 dated Oct. 28, 2013, 11 pages.
International Search Report and Written Opinion received for International PCT Application Serial No. PCT/US2013/056659 dated Nov. 8, 2013, 11 pages.
International Search Report and Written Opinion received for International PCT Application Serial No. PCT/US2013/056851 dated Nov. 18, 2013, 11 pages.
International Search Report and Written Opinion received for International PCT Application Serial No. PCT/US2022/040046 dated Oct. 27, 2022, 9 pages.
Notice of Allowance received for U.S. Appl. No. 17/584,921 dated Nov. 16, 2022, 9 pages.
Office Action received for Chinese Patent Application Serial No. 201380056070.2 dated Apr. 2, 2018, 6 pages.
Office Action received for Japanese Patent Application Serial No. 2018138425 dated Mar. 24, 2020, 7 pages.
Office Action received for Korean Patent Application Serial No. 1020157007516 dated Feb. 15, 2017, 18 pages.
Office Action received for Taiwan Patent Application Serial No. 107140922 dated Feb. 1, 2021, 9 pages.
Office Action received for Taiwanese Patent Applicatio Serial No. 102130565 dated Apr. 11, 2016, 2 pages.
Office Action received for Taiwanese Patent Application Serial No. 099113815 dated Jun. 18, 2014, 5 pages.
Office Action received for Taiwanese Patent Application Serial No. 101127182 dated Aug. 11, 2014, 11 pages.
Office Action received for Taiwanese Patent Application Serial No. 102130565 dated Jul. 14, 2015, 4 pages.
Office Action received for Taiwanese Patent Application Serial No. 10714924 dated Aug. 18, 2021, 5 pages.
Office Action received for Taiwanese Patent Application Serial No. Re: Taiwan Patent Application No. 110111617 dated Jun. 30, 2022, 8 pages.
Requirement for Restriction received for U.S. Appl. No. 13/193,299 dated Aug. 8, 2013, 7 pages.
Requirement for Restriction received for U.S. Appl. No. 13/193,345 dated Jun. 6, 2013, 8 pages.
Requirement for Restriction received for U.S. Appl. No. 13/596,976 dated Feb. 23, 2015, 8 pages.
Requirement for Restriction received for U.S. Appl. No. 13/597,050 dated Jan. 27, 2015, 7 pages.
Requirement for Restriction received for U.S. Appl. No. 13/597,093 dated Mar. 23, 2015, 9 pages.
Silapunt, R., et al., "Ion Bombardment Energy Control for Selective Fluorocarbon Plasma Etching of Organosilicate Glass", J. Vac. Sci. Technol, vol. B 22, No. 2, 2004, pp. 826-831.
Wang, S.B., et al., "Control of Ion Energy Distribution at Substrates During Plasma Processing", J. Applied Physics, vol. 88, No. 2, Jul. 15, 2000, pp. 643-646.
Wendt "Thomson Innovation Patent Export", Mar. 10, 2009, 10 pages.
Xiubo, et al., "Charging of Dielectric Substrate Materials During Plasma Immersion Ion Implantation", Nuclear Instruments and Methods in Physics Research B, vol. 187, 2002, pp. 485-491.
CNIPA, "Office Action Issued in Patent Application No. 202080057686.1", dated Feb. 28, 2023, p. 25, Published in: CN.

\* cited by examiner

Sheath voltage, $V_S$, when ion current is precisely compensated ($I_{ion} = I_{L2}$)

Output voltage, $V_O$, when ion current is precisely compensated ($I_{ion} = I_{L2}$)

Sheath voltage, $V_S$, when ion current is undercompensated
($I_{ion} > I_{L2}$)

Output voltage, $V_O$, when ion current is undercompensated ($I_{ion} > I_{L2}$)

Sheath voltage, $V_S$, when ion current is overcompensated
($I_{ion} < I_{L2}$)

Output voltage, $V_O$, when ion current is overcompensated
($I_{ion} < I_{L2}$)

```
┌─────────────────────────────────────────────────────────────────┐
│ Connect a first node of a small inductive element to a first    │
│ node of a switch and a second node of the small inductive       │
│ element to an output node with a capacitively coupled plasma    │
│ load connected between the output node and a return node       │
│                            1510                                 │
└─────────────────────────────────────────────────────────────────┘
                               │
                               ▼
        ┌──────────────────────────────────────────────┐
        │ Connect a first node of a large inductive    │
        │ element to either node of the small          │
        │ inductive element.                           │
        │                  1520                        │
        └──────────────────────────────────────────────┘
                               │
                               ▼
     ┌────────────────────────────────────────────────────┐
     │ Connect a voltage source between the second node   │
     │ of the switch and the second node of the large     │
     │ inductive element. Connect either node of the      │
     │ voltage source to the return node.                 │
     │                      1530                          │
     └────────────────────────────────────────────────────┘
                               │
                               ▼
   ┌────────────────────────────────────────────────────────┐
   │ Repeatedly close the switch for a time just long        │
   │ enough for the current through the switch to complete   │
   │ a full cycle from zero to a maximum amplitude, back to  │
   │ zero, to a maximum amplitude in the opposite direction  │
   │ and back to zero.                                       │
   │                        1540                             │
   └────────────────────────────────────────────────────────┘
                               │
                               ▼
        ┌──────────────────────────────────────────────┐
        │ Adjust the voltage of the voltage source and │
        │ the time between the repeated switch closures│
        │ to achieve a desired waveform of a voltage of│
        │ the plasma load.                             │
        │                    1550                      │
        └──────────────────────────────────────────────┘
```

FIG. 15A

```
┌─────────────────────────────────────────────────────────────────┐
│ Connect a first node of a primary winding of a transformer to a │
│ first node of a switch and a first node of a secondary winding  │
│ of the transformer to an output node with a capacitively        │
│ coupled plasma load connected between the output node and a     │
│ second node of the secondary of the transformer                 │
│ 1511                                                            │
└─────────────────────────────────────────────────────────────────┘
                                  │
                                  ▼
┌─────────────────────────────────────────────────────────────────┐
│ Connect a voltage source between the second node of the switch  │
│ and the second node of the primary winding of the transformer.  │
│ 1521                                                            │
└─────────────────────────────────────────────────────────────────┘
                                  │
                                  ▼
┌─────────────────────────────────────────────────────────────────┐
│ Repeatedly close the switch for a time just long enough for the │
│ current through the switch to complete a full cycle from zero   │
│ to a maximum amplitude, back to zero, to a maximum amplitude    │
│ in the opposite direction and back to zero.                     │
│ 1531                                                            │
└─────────────────────────────────────────────────────────────────┘
                                  │
                                  ▼
┌─────────────────────────────────────────────────────────────────┐
│ Adjust the voltage of the voltage source and the time between   │
│ the repeated switch closures to achieve a desired waveform of   │
│ a voltage of the plasma load.                                   │
│ 1541                                                            │
└─────────────────────────────────────────────────────────────────┘
```

FIG. 15B

BIAS SUPPLY WITH A SINGLE CONTROLLED SWITCH

CLAIM OF PRIORITY UNDER 35 U.S.C. § 119

The present application for patent claims priority to Provisional Application No. 62/873,680 entitled "A SINGLE CONTROLLED SWITCH, SINGLE SUPPLY EV SOURCE WITH ION CURRENT COMPENSATION" filed Jul. 12, 2019 and assigned to the assignee hereof and hereby expressly incorporated by reference herein.

BACKGROUND

Field

The present invention relates generally to power supplies, and more specifically to power supplies for applying a voltage for plasma processing.

Background

Many types of semiconductor devices are fabricated using plasma-based etching techniques. If it is a conductor that is etched, a negative voltage with respect to ground may be applied to the conductive substrate so as to create a substantially uniform negative voltage across the surface of the substrate conductor, which attracts positively charged ions toward the conductor, and as a consequence, the positive ions that impact the conductor have substantially the same energy.

If the substrate is a dielectric, however, a non-varying voltage is ineffective to place a voltage across the surface of the substrate. But an alternating current (AC) voltage (e.g., high frequency AC or radio frequency (RF)) may be applied to the conductive plate (or chuck) so that the AC field induces a voltage on the surface of the substrate. During the positive peak of the AC cycle, the substrate attracts electrons, which are light relative to the mass of the positive ions; thus, many electrons will be attracted to the surface of the substrate during the positive peak of the cycle. As a consequence, the surface of the substrate will be charged negatively, which causes ions to be attracted toward the negatively-charged surface during the rest of the AC cycle. And when the ions impact the surface of the substrate, the impact dislodges material from the surface of the substrate—effectuating the etching.

In many instances, it is desirable to have a narrow ion energy distribution, but applying a sinusoidal waveform to the substrate induces a broad distribution of ion energies, which limits the ability of the plasma process to carry out a desired etch profile. Known techniques to achieve a narrow ion energy distribution are expensive, inefficient, difficult to control, and may adversely affect the plasma density. As a consequence, these known techniques have not been commercially adopted. Accordingly, a system and method are needed to address the shortfalls of present technology and to provide other new and innovative features.

SUMMARY

An aspect of some implementations disclosed herein address the above stated needs by utilizing switching frequency as a means of control together with a single controlled switch in a resonant circuit requiring only one variable voltage supply to enable a drastically simplified circuit to provide a desired narrow energy distribution.

Another aspect may be characterized as a power supply that comprises an output node, a return node, a switch, a first inductor, a second inductor, and a voltage source. The first inductor is coupled between a first node of the switch and the output node and a first node of a second inductor is coupled to one of the output node or the first node of the switch. A voltage source is coupled between a second node of the switch and a second node of the second inductor and a connection is made between the return node and one of the second node of the switch and the second node of the second inductor. A controller is configured to cause an application of the periodic voltage between the output node and the return node by repeatedly closing the switch for a time just long enough for current through the switch to complete a full cycle from zero to a peak value, back to zero, to a peak value in an opposite direction and back to zero.

Yet another aspect may be characterized as a power supply comprising an output node, return node, a switch, a transformer, and a voltage source. A first node of a primary winding of the transformer is coupled to a first node of the switch, a first node of a secondary winding of the transformer is coupled to the output node, and a second node of the secondary winding of the transformer is coupled to the return node. A voltage source is coupled between a second node of the switch and a second node of the primary winding of the transformer. The power supply also comprises a controller configured to cause an application of the periodic voltage between the output node and the return node by repeatedly closing the switch for a time just long enough for current through the switch to complete a full cycle from zero to a peak value, back to zero, to a peak value in an opposite direction and back to zero.

Another aspect disclosed herein is a plasma processing system that comprises a plasma chamber and a bias supply. The plasma chamber comprises a volume to contain a plasma, an input node, and a return node. The bias supply includes a switch, a first inductor, a second inductor, and a voltage source. The first inductor is coupled between a first node of the switch and the input node of the plasma chamber and a first node of a second inductor is coupled to one of the input node of the chamber or the first node of the switch. The voltage source is coupled between a second node of the switch and a second node of the second inductor. A connection is made between the return node and one of the second node of the switch or the second node of the second inductor. The plasma processing system also comprises means for controlling the switch and voltage source to achieve a desired waveform of a voltage of a plasma load when the plasma is in the plasma chamber.

Yet another aspect may be characterized as a plasma processing system comprising a plasma chamber and a bias supply. The plasma processing chamber comprises a volume to contain a plasma, an input node, and a return node, and the bias supply comprises a switch, a transformer, and a voltage source. A first node of a primary winding of the transformer is coupled to a first node of the switch, a first node of a secondary winding of the transformer is coupled to the input node of the plasma chamber, and a second node of the secondary winding of the transformer is coupled to the return node. The voltage source is coupled between a second node of the switch and a second node of the primary winding of the transformer. The plasma processing system also includes means for controlling the switch and voltage source to achieve a desired waveform of a voltage of a plasma load when the plasma is in the plasma chamber.

BRIEF DESCRIPTION OF THE DRAWINGS

FIG. 15A is a flowchart depicting a method that may be traversed in connection with several embodiments;

FIG. 15B is a flowchart depicting another method that may be traversed in connection with several embodiments;

DETAILED DESCRIPTION

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

For the purposes of this disclosure, source generators are those whose energy is primarily directed to generating and sustaining the plasma, while "bias supplies" are those whose energy is primarily directed to generating a surface potential for attracting ions and electrons from the plasma.

Described herein are several embodiments of novel bias supplies that may be used to apply a periodic voltage function to a substrate support in a plasma processing chamber.

Figure 1:
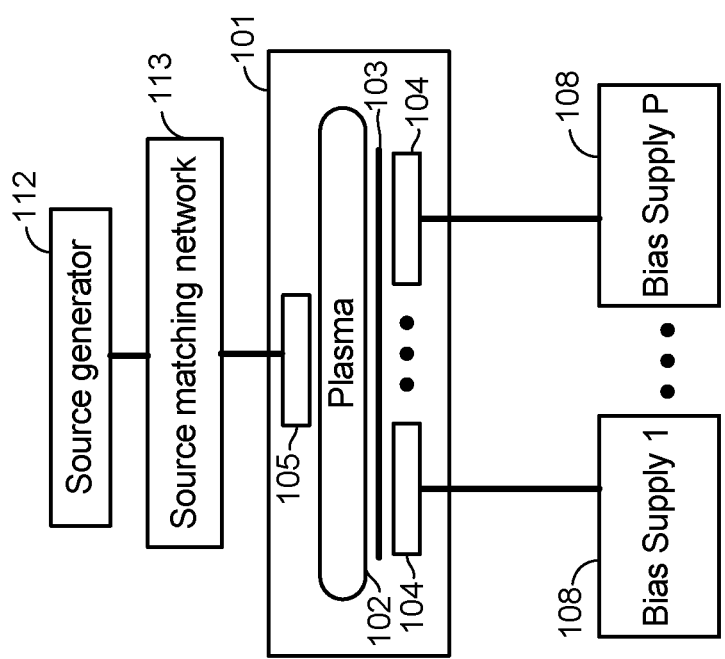
FIG. 1 is a block diagram depicting an exemplary plasma processing environment in which bias supplies disclosed herein may be utilized.

Referring first to FIG. 1, shown is an exemplary plasma processing environment (e.g., deposition or etch system) in which bias supplies may be utilized. The plasma processing environment may include many pieces of equipment coupled directly and indirectly to a plasma chamber 101, within which a volume containing a plasma 102 and workpiece 103 (e.g., a wafer) is contained. The equipment may include vacuum handling and gas delivery equipment (not shown), one or more bias supplies 108, one or more source generators 112, and one or more source matching networks 113. In many applications, power from a single source generator 112 is connected to one or multiple source electrodes 105. The source generator 112 may be a higher frequency RF generator (e.g. 13.56 MHz to 120 MHz). The electrode 105 generically represents what may be implemented with an inductively coupled plasma (ICP) source, a dual capacitively-coupled plasma source (CCP) having a secondary top electrode biased at another RF frequency, a helicon plasma source, a microwave plasma source, a magnetron, or some other independently operated source of plasma energy.

In variations of the system depicted in FIG. 1, the source generator 112 and source matching network 113 may be replaced by, or augmented with, a remote plasma source. And other variations of the system may include only a single bias supply 108.

While the following disclosure generally refers to plasma-based wafer processing, implementations can include any substrate processing within a plasma chamber. In some instances, objects other than a substrate can be processed using the systems, methods, and apparatus herein disclosed. In other words, this disclosure applies to plasma processing of any object within a sub-atmospheric plasma processing chamber to affect a surface change, subsurface change, deposition or removal by physical or chemical means.

Figure 2:
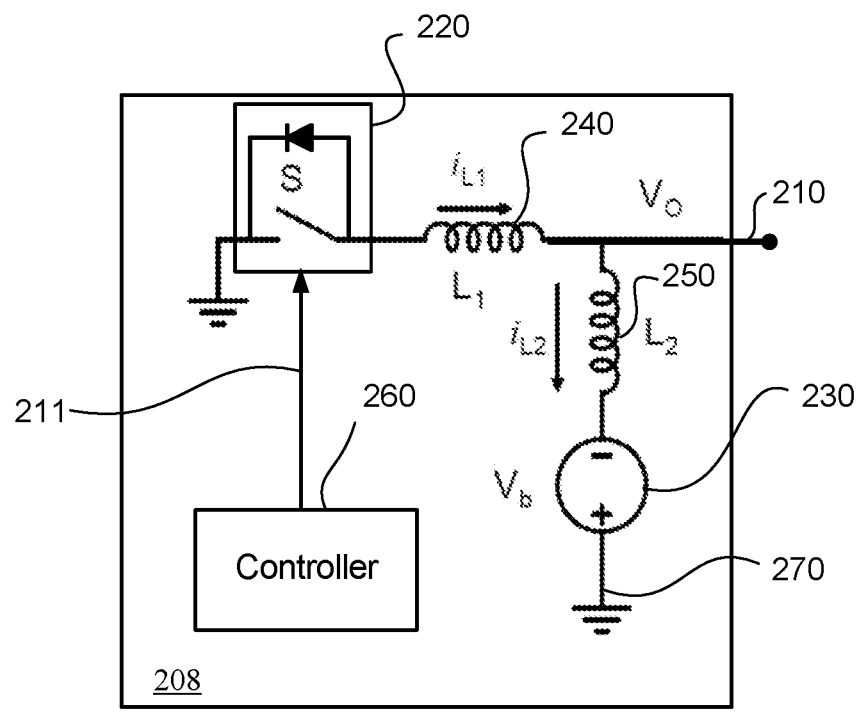
FIG. 2 is a schematic diagram depicting an exemplary bias supply.

Referring to FIG. 2, shown is an exemplary bias supply 208 to apply a periodic voltage function. As shown, the bias supply 208 includes an output 210 (also referred to as an output node 210), a switch 220 and a voltage source 230. In addition, a first inductor 240 is coupled between the switch and the output and a second inductor 250 is coupled between the voltage source and the output. Also shown is a controller 260 that is configured to open and close the switch 220 to produce a voltage at the output as described further herein. For example, the controller 260 may be configured to cause an application of the periodic voltage between the output 210 (also referred to as an output node 210) and the ground connection 270 (also referred to as a return node 270) by repeatedly closing the switch for a time just long enough for current through the switch to complete a full cycle from zero to a peak value, back to zero, to a peak value in an opposite direction and back to zero. Current delivered to the load through output 210 is returned to the bias supply 208 through the ground connection 270 that is common with the load.

Figure 3:
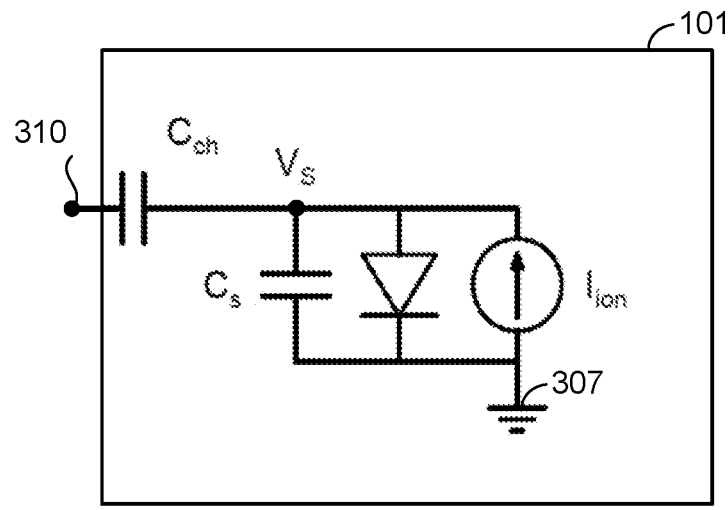
FIG. 3 is a schematic diagram electrically representing aspects of a plasma processing chamber.

Referring briefly to FIG. 3, shown is a schematic drawing that electrically depicts aspects of a plasma load within the plasma chamber 101. As shown, the plasma chamber 101 may be represented by a chuck capacitance $C_{ch}$ (that includes a capacitance of a chuck and workpiece 103) that is positioned between an input 310 (also referred to as an input node 310) to the plasma chamber 101 and a node representing a voltage, Vs, at a surface of the substrate (also referred to herein as a sheath voltage). In addition, a return node 307 (which may be a connection to ground) is depicted. The plasma 102 in the processing chamber is represented by a parallel combination of a sheath capacitance $C_S$, a diode, and a current source. The diode represents the non-linear, diode-like nature of the plasma sheath that results in rectification of the applied AC field, such that a direct-current (DC) voltage drop, appears between the workpiece 103 and the plasma 102.

Referring again to FIG. 2, the switch 220 (like most field-effect switches) includes a body diode allowing for reverse current flow even when the switch is not controlled to be in an on state. Applicant has found that the body diode may be used as an advantage in that the switch 220 (by virtue of the body diode) can be turned off any time during a first reversal of current through the switch; thus, reducing the timing criticality of the control. Although other types of switches may be used, the switch may be realized by silicon carbide metal-oxide semiconductor field-effect transistors (SiC MOSFETs). It should be recognized that a drive signal 211 from the controller may be electrical or optical. It should also be understood that the switches depicted in the other bias supplies disclosed herein (e.g., in FIG. 11, and FIGS. 16A-F) may also include a body diode, and those switches of the other bias supply may be driven by a drive signal 211.

Figure 4:
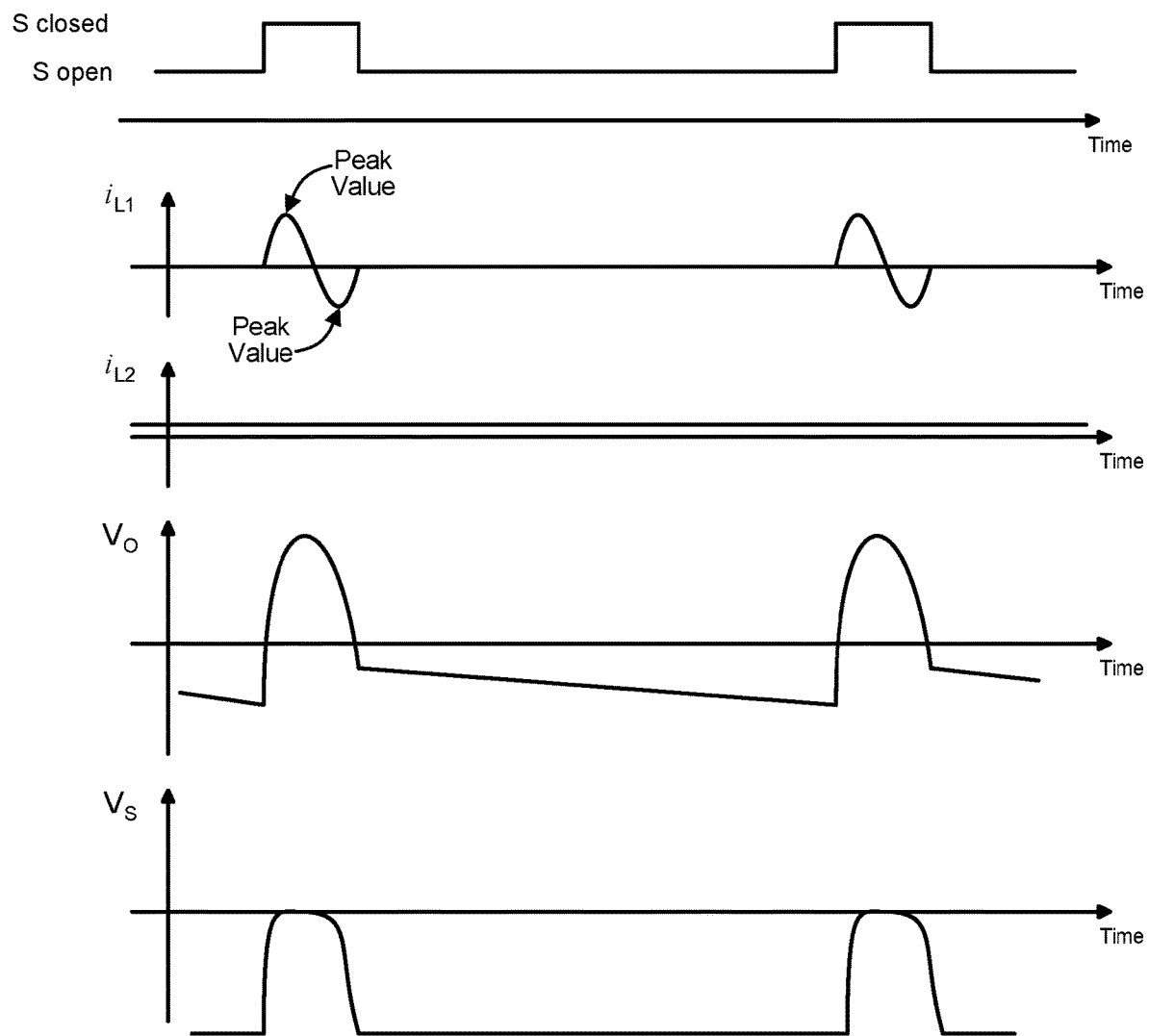
FIG. 4 is a timing diagram depicting timing of electrical aspects of the bias supply in FIG. 2 when operated with the plasma processing chamber in FIG. 3.

Referring to FIG. 4, shown are waveforms depicting electrical aspects of the bias supply 208 and plasma processing chamber 101 when ion current, $I_{ion}$, is properly compensated, which happens when the current, $i_{L2}$, through the second inductor, $L_2$, equals the ion current, $I_{ion}$. An aspect of the present disclosure addresses the problem of how to adjust the current, $i_{L2}$, through $L_2$ to be equal to the ion current $I_{ion}$. As shown in FIG. 4, the switch 220 (also referred to herein as switch, S) may be controlled so that current through first inductor 240, and hence the switch 220, completes a full cycle from zero to a peak value, back to zero, to a peak value in an opposite direction and back to zero. It should be recognized the peak value the current, $i_{L2}$, is a first half of the current cycle may be different than the peak value of the current, $i_{L2}$, in the second half of the current cycle. The controller 260 may also be configured to adjust a voltage of the voltage source 230 and a time between the repeated switch closures to achieve a desired periodic voltage at $V_O$.

Figure 5A:
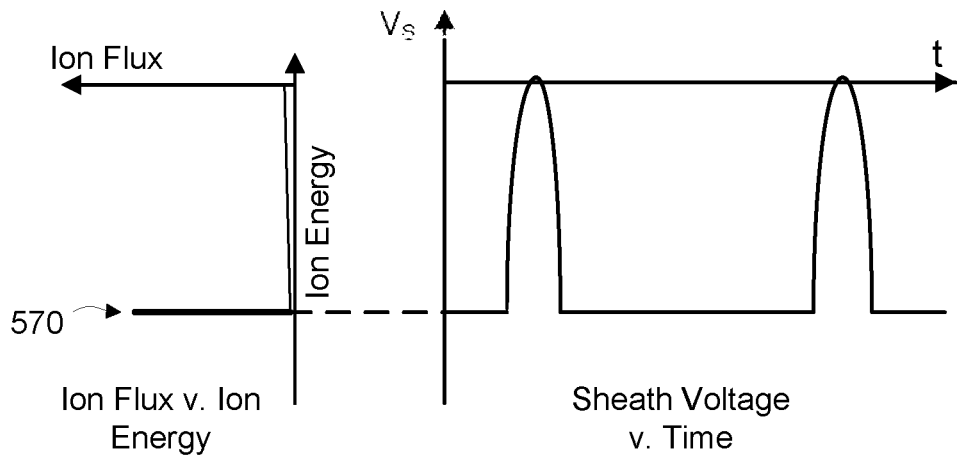
FIG. 5A is a graphical depiction of sheath voltage versus time and a resulting ion flux versus ion energy.
Figure 5B:
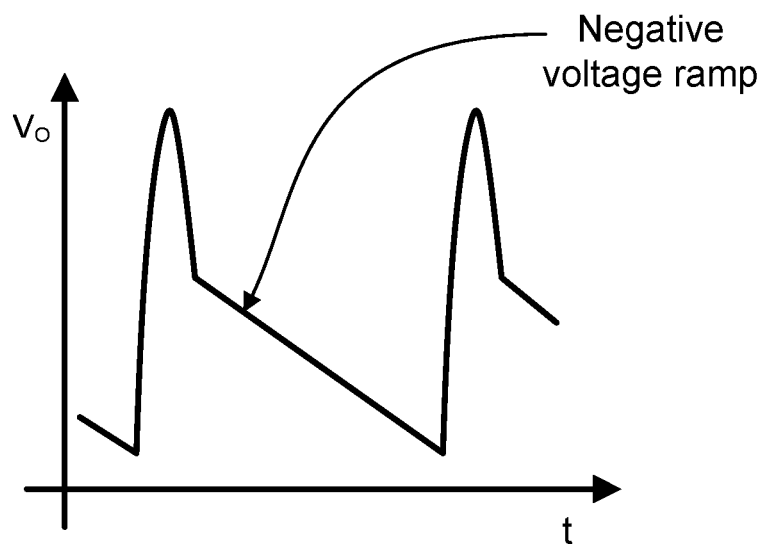
FIG. 5B is a graph of a periodic voltage waveform that may produce the sheath voltage depicted in FIG. 5A.

Referring briefly to FIG. 5A to FIG. 7B depicted is background material helpful to understand the effect of ion current compensation on a distribution of ion energies in the plasma chamber 101. Reference is made first to FIGS. 5A and 5B in a mode of operation where $I_{L2}=I_{Ion}$. As shown in FIG. 5A, when a sheath voltage is substantially constant between pulses, a spread of corresponding ion energies 570 is relatively narrow to produce a substantially monoenergetic ion energy distribution function. Shown in FIG. 5B is an asymmetric periodic voltage function, which may be applied by the bias supply 108 to produce the sheath voltage in FIG. 5A.

Figure 6A:
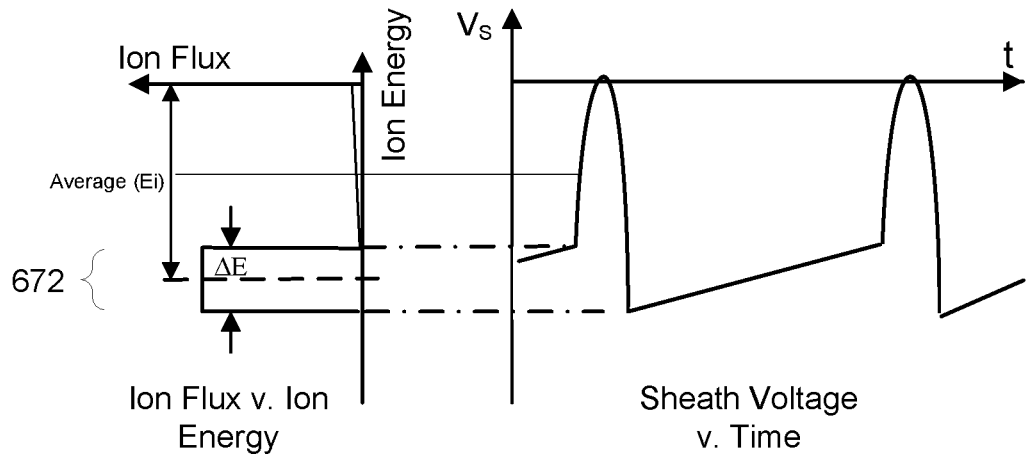
FIG. 6A depicts another sheath voltage and a resulting ion flux versus ion energy.
Figure 6B:
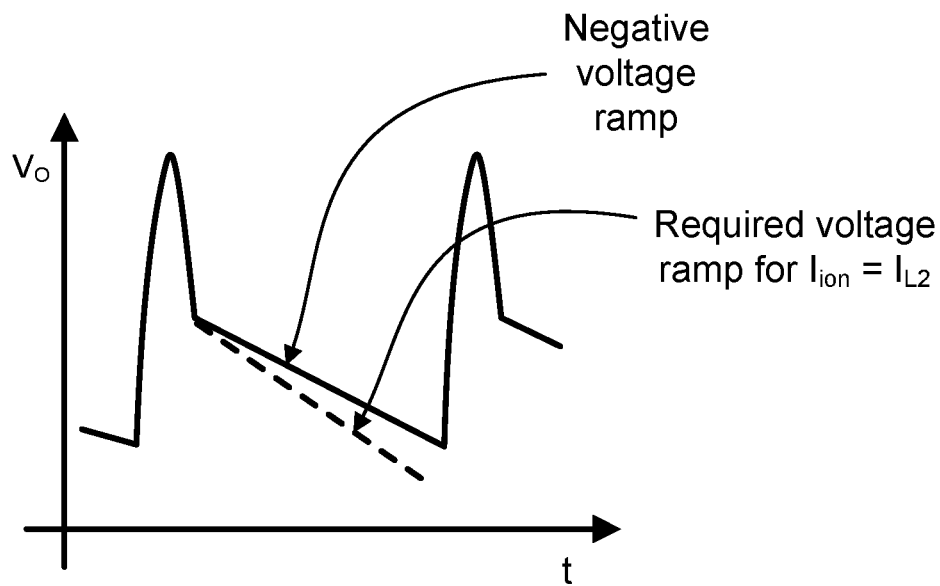
FIG. 6B is a graph of a periodic voltage waveform that may produce the sheath voltage depicted in FIG. 6A.

Referring to FIGS. 6A and 6B, shown are aspects of sheath voltage, ion flux, and a periodic asymmetric voltage waveform (output by a bias supply) associated with undercompensated ion current. As shown in FIG. 6A, when ion current, $I_{ion}$, is under compensated, a sheath voltage becomes less negative in a ramp-like manner, which produces a broader spread 672 of ion energies. Shown in FIG. 6B is a periodic voltage that may be applied to a substrate support to effectuate the sheath voltage depicted in FIG. 6A. As shown, the negative ramp-like portion of the periodic voltage waveform drops with a lower slope than the ramp-like portion of the period voltage waveform of FIG. 5B (shown as a broken line in FIG. 6B). Note that such a spread 672 of ion energies may be done deliberately.

Figure 7A:
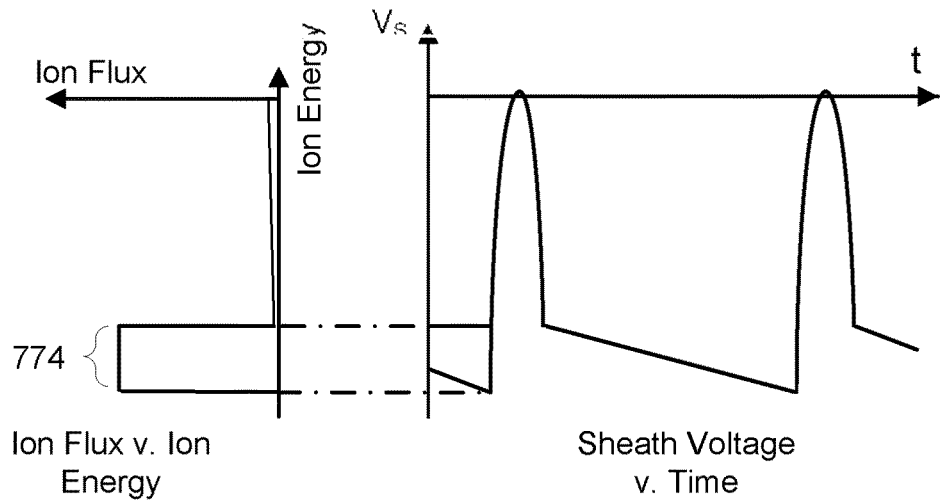
FIG. 7A depicts yet another sheath voltage and a resulting ion flux versus ion energy.
Figure 7B:
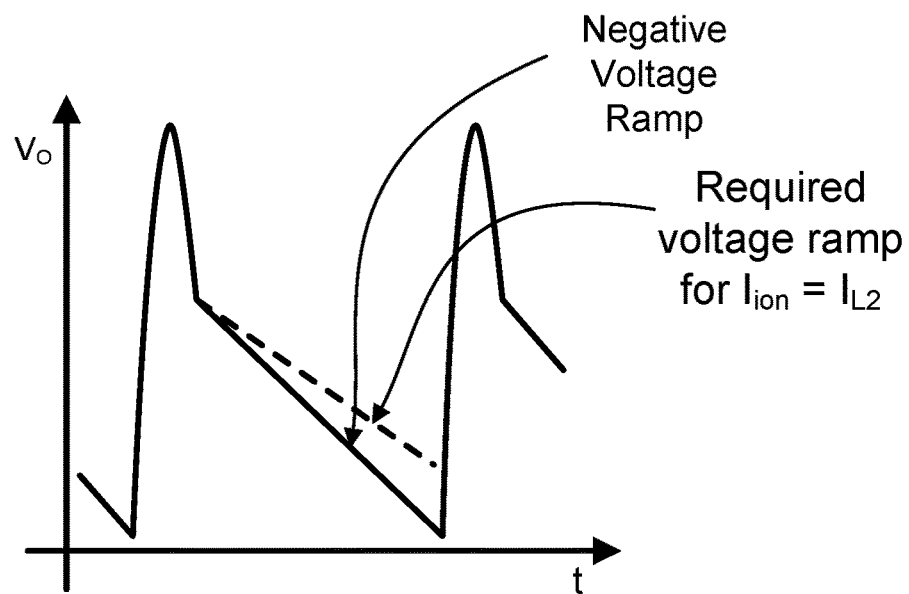
FIG. 7B is a graph of a periodic voltage waveform that may produce the sheath voltage depicted in FIG. 7A.

FIGS. 7A and 7B depict aspects of sheath voltage, ion flux, and a periodic asymmetric voltage waveform (output by a bias supply) associated with over-compensated ion current. As shown in FIG. 7A, when ion current is over compensated, a sheath voltage becomes more negative in a ramp-like manner, which also produces a broader spread 774 of ion energies. Shown in FIG. 7B, is a periodic voltage waveform that may be applied to a substrate support to effectuate the sheath voltage depicted in FIG. 7A. As shown, the negative ramp-like portion of the periodic voltage function drops at a greater rate than the ramp-like portion of a period voltage waveform that compensates for ion current (shown as a dotted line). Such a spread 774 of ion energies may be done deliberately and may be desired.

Referring back to FIGS. 2, 3 and 4, Applicant has found that the current, $i_{L2}$, through $L_2$, and hence the compensation current, may be controlled by controlling a pulse repetition rate of the periodic voltage applied at the output, $V_O$, of the bias supply. And the pulse repetition rate may be controlled by the timing of an opening and closing of the switch. Applicant examined what happened, if after one turn-on of the switch, the time to the next turn-on was modified. For example, Applicant considered what would happens to the applied voltage, $V_O$, if the second turn-on of the switch, S, happens slightly earlier in the case where $V_O$ is constant between the time periods where the switch is on. In this case, the second turn-on starts with the same initial conditions so the form of the second voltage pulse of the applied voltage, $V_O$, should be the same. Because the time between pulses is now shorter, the average of the applied voltage, $V_O$, is higher; thus, the current through $L_2$ should increase. The increase in $i_{L2}$ increases the downward slope of the applied voltage, $V_O$, increasing the magnitude of the second pulse further. So, increasing the pulse repetition rate is a handle to increase the ion current compensation. This is confirmed through simulation as FIGS. 8-10 show.

Figure 8:
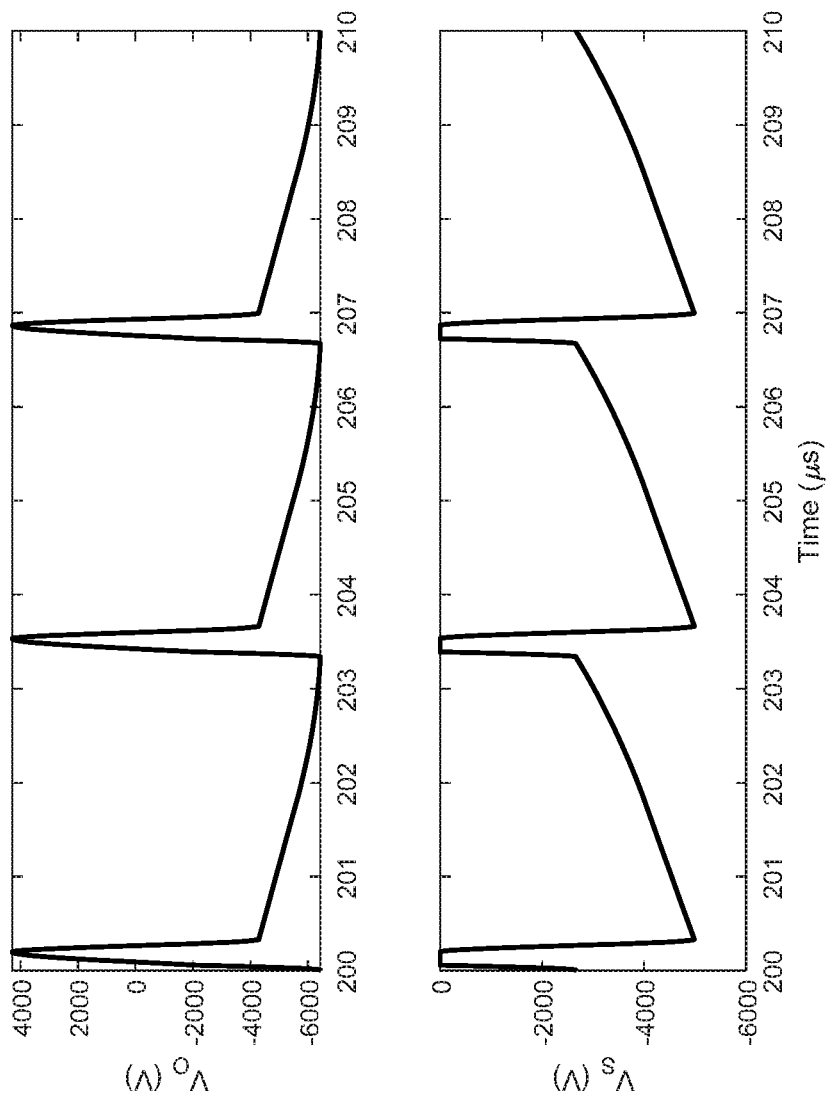
FIG. 8 includes graphs depicting a periodic voltage waveform that may be applied by the bias supply of FIG. 2 and a corresponding sheath voltage.

Referring to FIG. 8, it is a graph depicting the bias supply output voltage, $V_O$, and the sheath voltage, Vs, for the circuit of FIG. 2 connected to a load as shown in FIG. 3 in which $L_1=3$ µH, $L_2=4$ mH, $C_{ch}=1.5$ nF, $C_S=1$ nF, and $I_{ion}=3$ A when the voltage source 230, $V_b$, provides a DC voltage of 5 kV and the switch is opened and closed to provide a pulse repetition rate of $V_O$ at 300 kHz. Operating the circuit with these parameters results in an initial sheath voltage, $V_S$, of −5 kV rising to −2.6 kV because the ion current is under-compensated. As shown in FIG. 2, the repetition rate of the switch closing may be the same as the pulse repetition rate of $V_O$, And the closing the switch may be for a time long enough for current $I_{L1}$ through the switch to complete a full cycle from zero to a peak value, back to zero, to a peak value in an opposite direction and back to zero. It should also be recognized that the current $I_{L2}$ may be substantially constant during a cycle of the periodic voltage at $V_O$.

Figure 9:
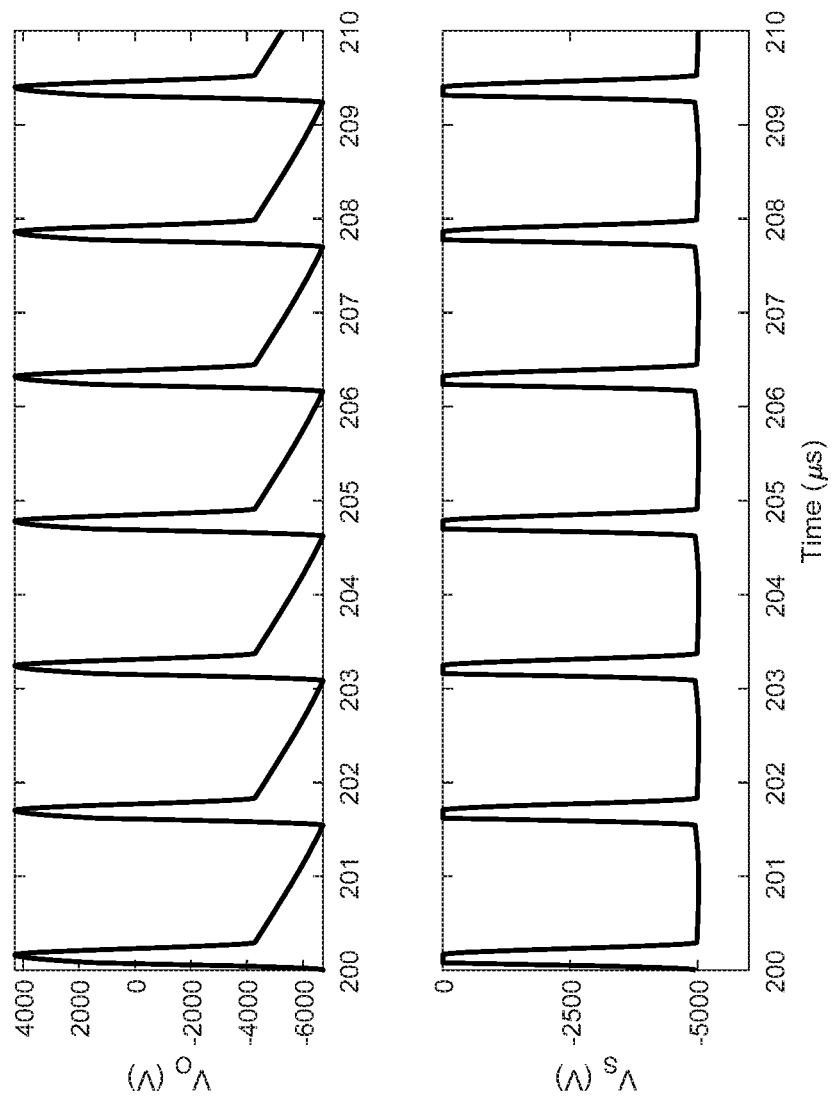
FIG. 9 includes graphs depicting another periodic voltage waveform that may be applied by the bias supply of FIG. 2 and a corresponding sheath voltage.

Referring next to FIG. 9, shown is a graph depicting the bias supply output voltage, $V_O$, and the sheath voltage, Vs, with the same parameters as in FIG. 8, except when the voltage source 230, $V_b$, provides a DC voltage of 4.5 kV and the switch is opened and closed to provide a pulse repetition rate of 650 kHz. Operating the bias supply with these parameters results in a constant sheath voltage of −5 kV because the ion current is precisely compensated.

Figure 10:
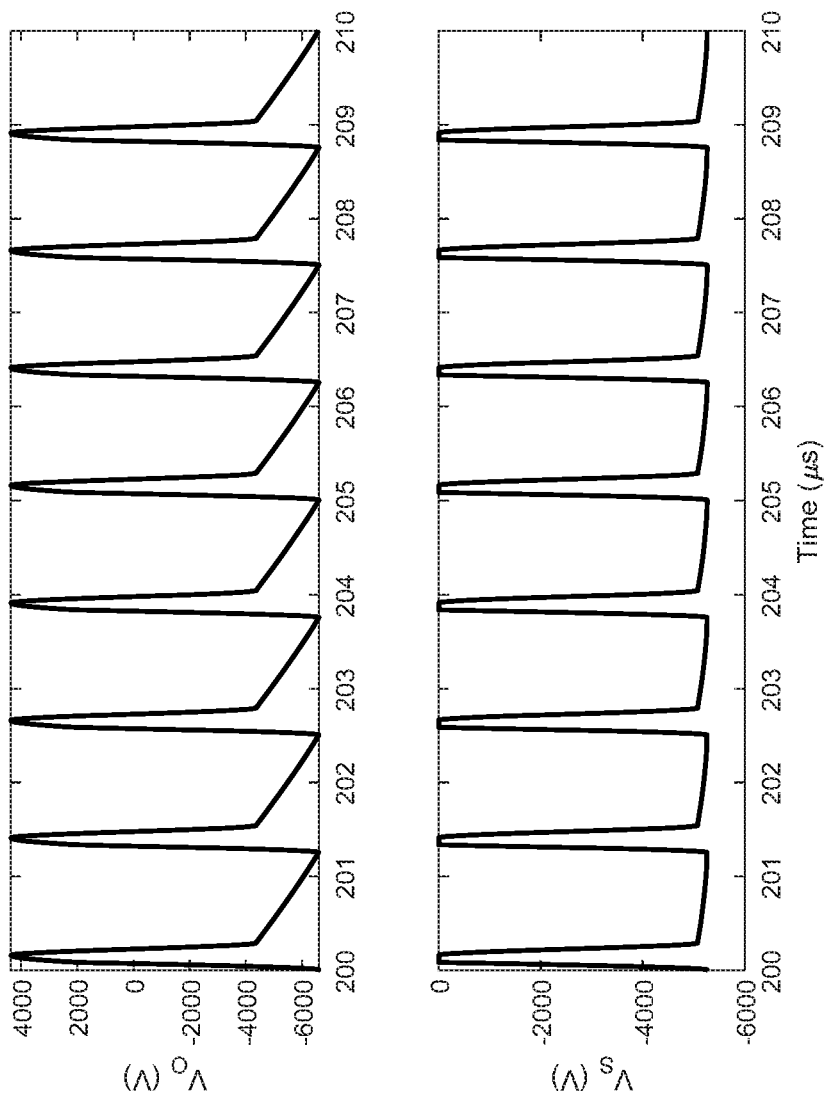
FIG. 10 includes graphs depicting another periodic voltage waveform that may be applied by the bias supply of FIG. 2 and a corresponding sheath voltage.

Referring to FIG. 10, shown is a graph depicting the bias supply output voltage, $V_O$, and the sheath voltage, $V_S$, with the same parameters as in FIG. 8, except when the voltage source, $V_b$, provides a DC voltage equal to 4.25 kV and the switch is open and closed to provide $V_O$ with a pulse repetition rate of 800 kHz. Operating the circuit with these parameters results in an initial sheath voltage of −5 kV decreasing to −5.25 kV because the ion current is over-compensated.

Figure 11:
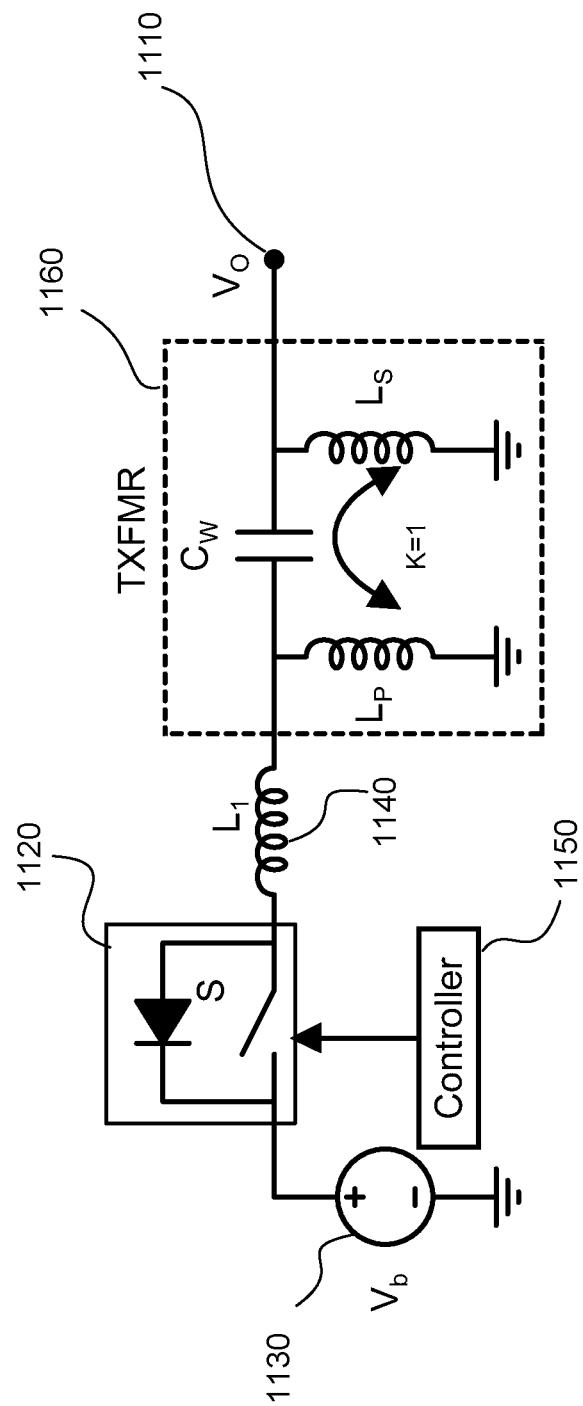
FIG. 11 is a schematic diagram depicting another exemplary bias supply.

Referring next to FIG. 11 shown is a schematic of circuit of a bias supply that includes a transformer 1160 to couple a periodic voltage function to an output 1110 (also referred to as an output node 1110). As shown, the bias supply includes a voltage source 1130 and an inductor 1140 coupled to a switch 1120 and the transformer 1160. A controller 1150 is coupled to the switch and the controller is configured to open and close the switch to produce an asymmetric voltage at the output. The inductor 1140 may be a discrete inductor or part of the leakage inductance of the transformer 1160. For simulation purposes the transformer is modeled as two perfectly coupled inductors. Parasitic capacitance between the transformer windings is modeled by $C_W$.

Figure 12:
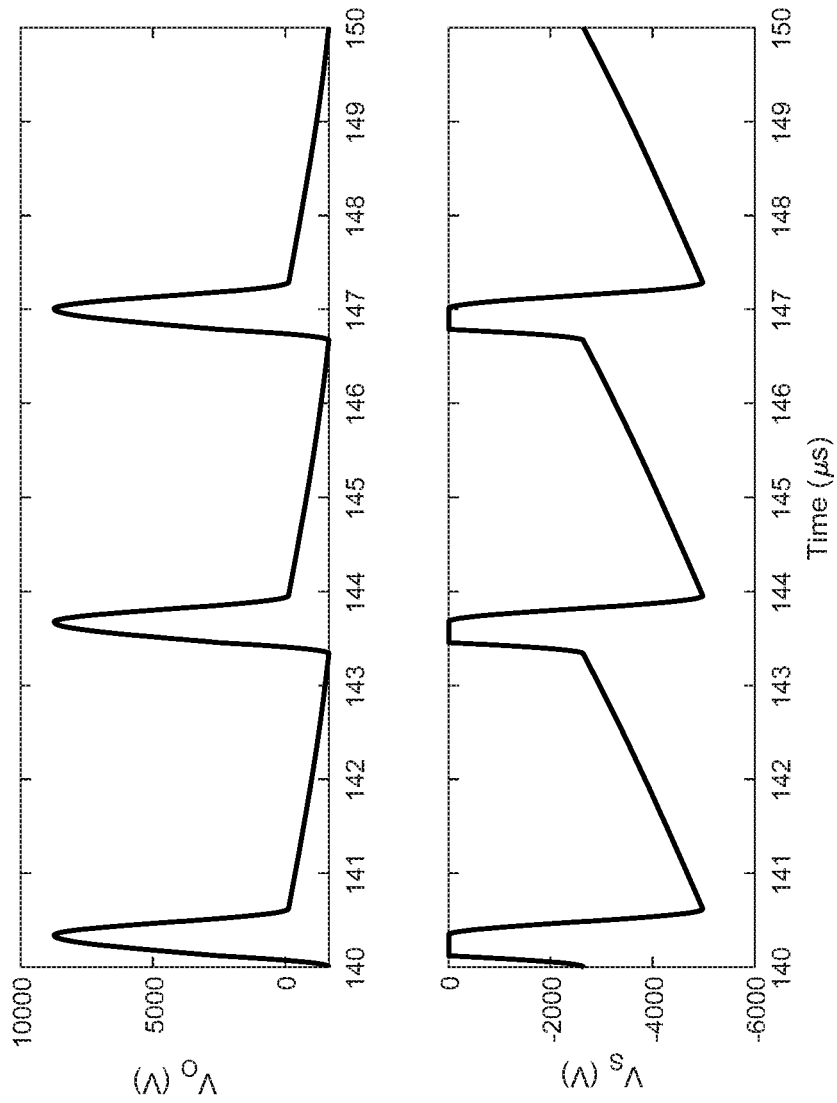
FIG. 12 includes graphs depicting a periodic voltage waveform that may be applied by the bias supply of FIG. 11 and a corresponding sheath voltage.

FIG. 12 is a graph depicting the bias supply output voltage, $V_O$, and the sheath voltage, $V_S$, for the circuit of FIG. 11 connected to a load as shown in FIG. 3 in which $L_1=50$ nH, $L_P=56$ µH, $L_S=5.6$ mH, $C_W=1.26$ nF, $C_{ch}=1.5$ nF, $C_S=1$ nF, and $I_{ion}=3$ A when the voltage source of the bias supply of FIG. 11 applies 422 VDC and the controller opens and closes the switch to produce a periodic voltage at the output with a pulse repetition rate of 300 kHz. Operating the bias supply with these parameters results in an initial sheath voltage of −5 kV increasing to −2.8 kV because the ion current is under-compensated.

Figure 13:
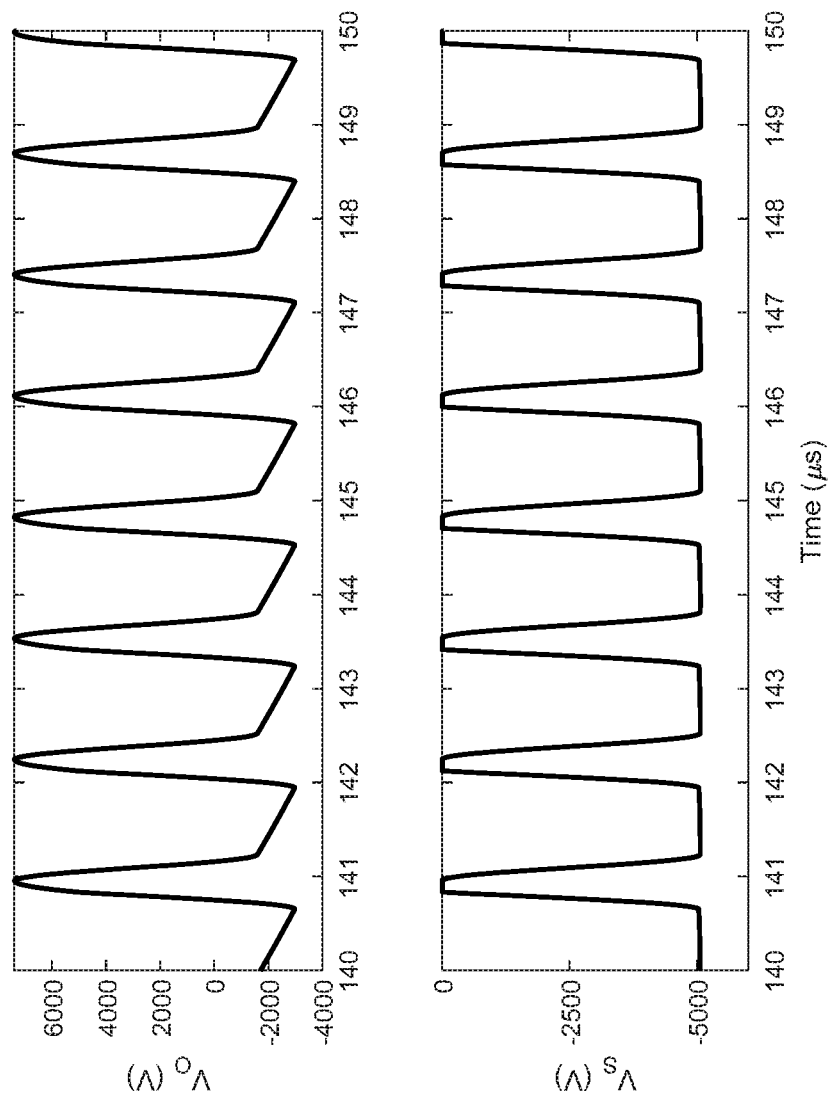
FIG. 13 includes graphs depicting another periodic voltage waveform that may be applied by the bias supply of FIG. 11 and a corresponding sheath voltage.

FIG. 13 is a graph depicting the bias supply output voltage, $V_O$, and the sheath voltage, $V_S$, with the same parameters as in FIG. 12, except when the voltage source of the bias supply of FIG. 11 applies 281 VDC and the controller opens and closes the switch to produce a periodic voltage at the output with a pulse repetition rate of 775 kHz. Operating the circuit with these parameters results in a constant sheath voltage of −5 kV because the ion current is precisely compensated.

Figure 14:
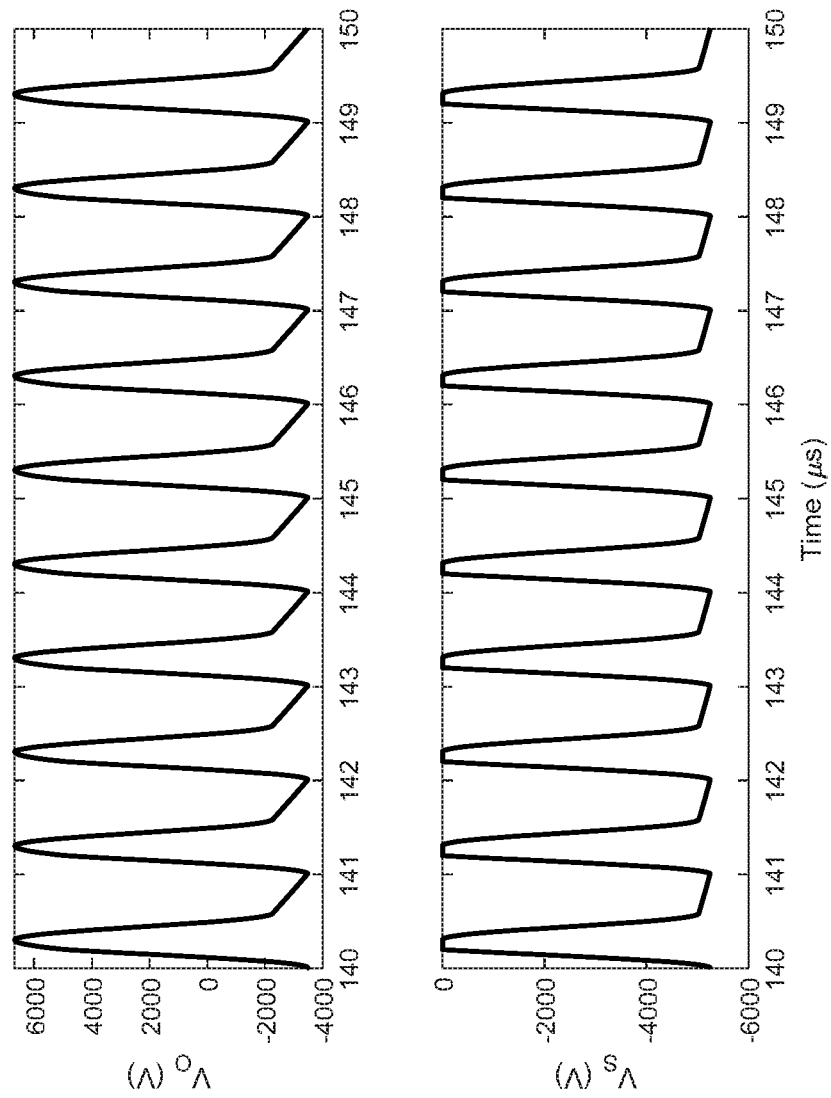
FIG. 14 includes graphs depicting yet another periodic voltage waveform that may be applied by the bias supply of FIG. 11 and a corresponding sheath voltage.

FIG. 14 is a graph depicting sheath the bias supply output voltage, $V_O$, and the voltage, $V_S$, with the same parameters as in FIG. 12, except when the voltage source of the bias supply of FIG. 11 applies 212 VDC and the controller opens and closes the switch to produce a periodic voltage at the output with a pulse repetition rate of 1 MHz. Operating the circuit with these parameters results in an initial sheath voltage of −5 kV decreasing to −5.24 kV because the ion current is over-compensated.

Referring next to FIG. 15A, shown is a flow chart depicting a method that may be traversed in connection with embodiments disclosed herein (e.g., in connection with FIGS. 16A-16D). As shown, a first node of a first inductor (also referred to herein as a small inductive element) is connected to a first node of a switch and a second node of the small inductive element is connected to an output node with a capacitively coupled plasma load connected between the output node and a return node (Block 1510). A first node of a first inductor (also referred to a large inductive element) may be connected to either node of the small inductive element (Block 1520). As shown, a voltage source is connected between the second node of the switch and the second node of the large inductive element and either node of the voltage source is connected to the return node (Block 1530). In operation, the switch is repeatedly closed for a time just long enough for the current through the switch to complete a full cycle from zero to a peak value, back to zero, to a peak value in the opposite direction and back to zero (Block 1540). In addition, each of the voltage of the voltage source and the time between the repeated switch closures may be adjusted to achieve a desired waveform of a voltage of the plasma load (Block 1550). For example, the desired waveform may be a sheath voltage to achieve a narrow distribution of ion energies (e.g., as shown in FIG. 5A) or a broader distribution of ion energies (e.g., as shown in FIGS. 6A and 7A).

Figure 16A:
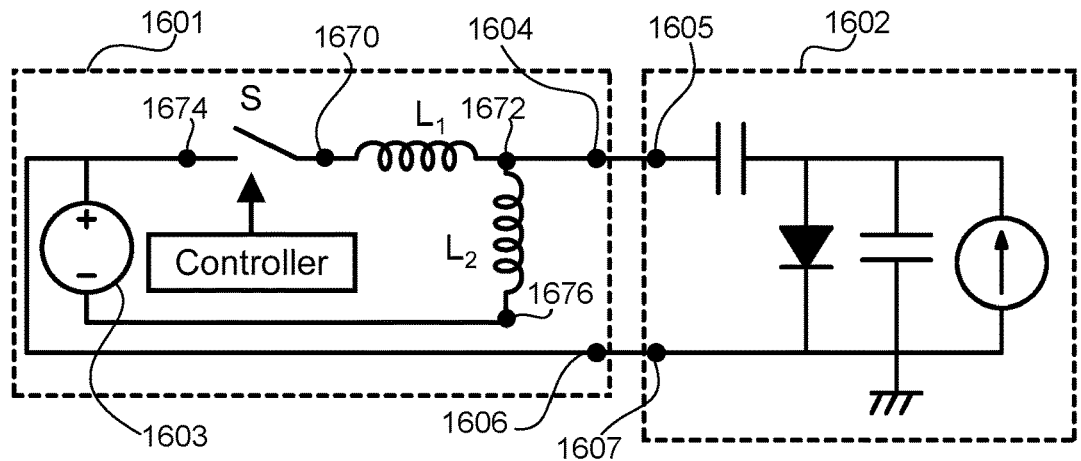
FIG. 16A is a schematic diagram depicting an exemplary bias supply.
Figure 16B:
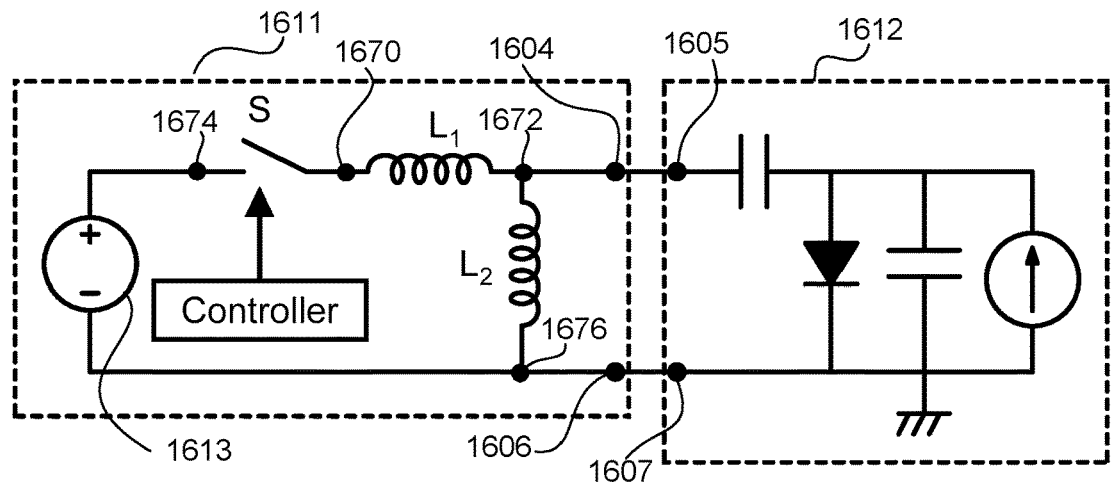
FIG. 16B is a schematic diagram depicting another exemplary bias supply.
Figure 16C:
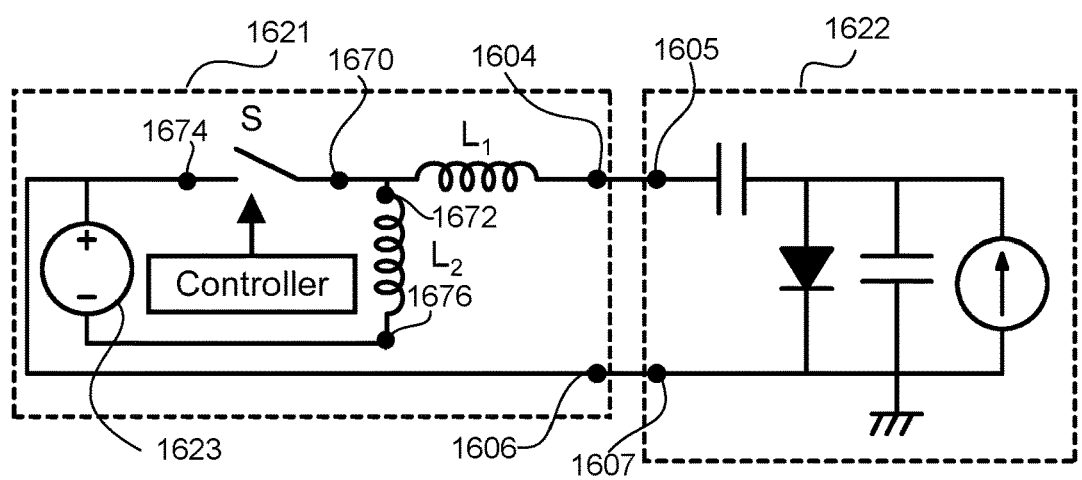
FIG. 16C is a schematic diagram depicting another exemplary bias supply.
Figure 16D:
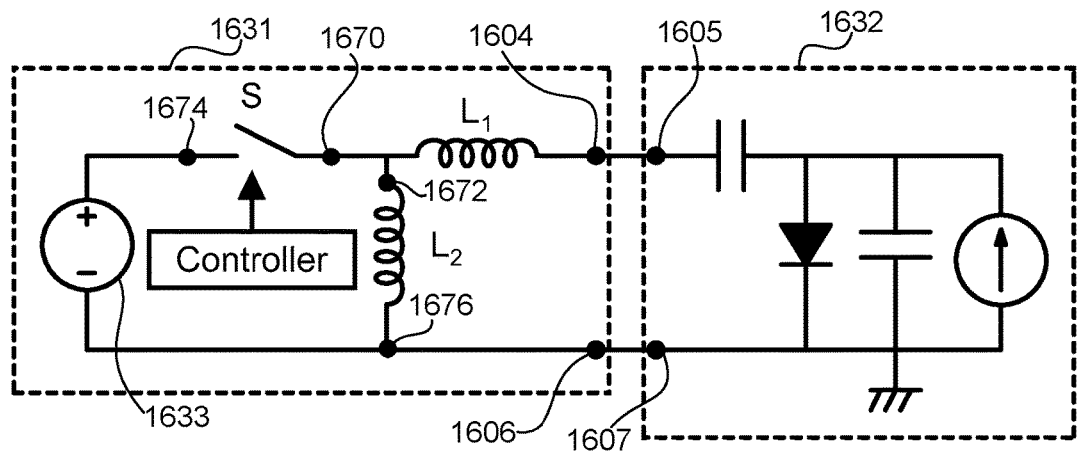
FIG. 16D is a schematic diagram depicting another exemplary bias supply.
Figure 16E:
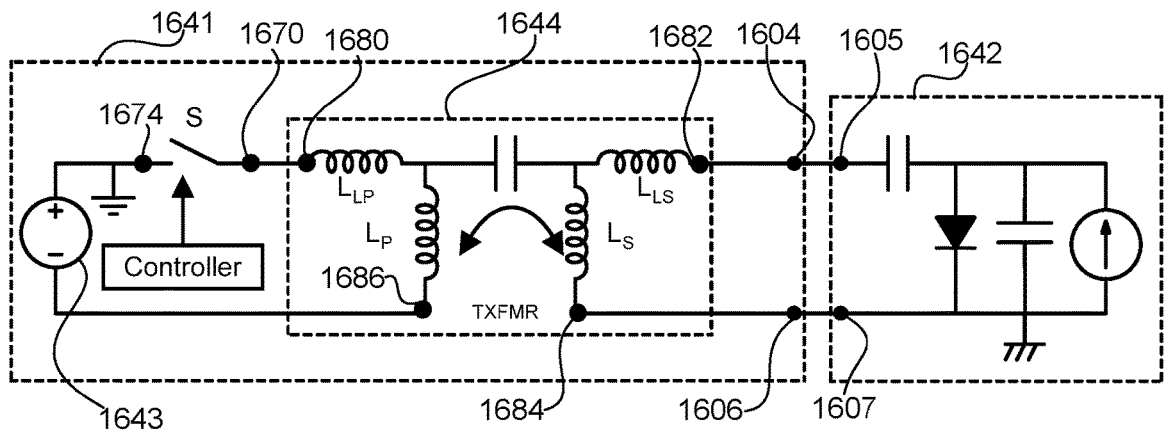
FIG. 16E is a schematic diagram depicting another exemplary bias supply.
Figure 16F:
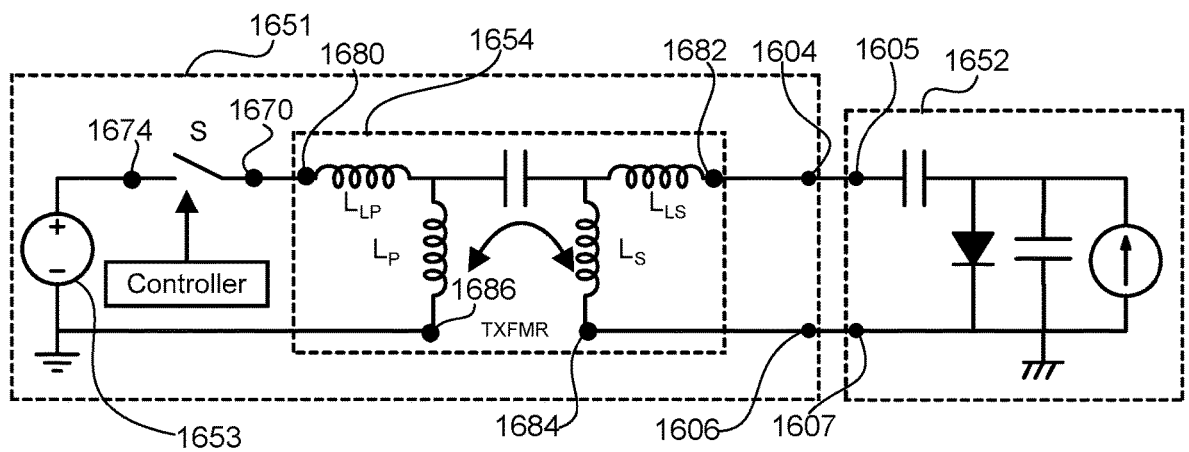
FIG. 16F is a schematic diagram depicting another exemplary bias supply.

FIG. 15B is another flow chart depicting a method that may be traversed in connection with embodiments disclosed herein (e.g., in connection with FIGS. 16E and 16F). As shown, a first node of a primary winding of a transformer is connected to a first node of a switch and a first node of a secondary winding of the transformer to an output node with a capacitively coupled plasma load connected between the output node and a second node of the secondary of the transformer (Block 1511). In addition, a voltage source is connected between the second node of the switch and the second node of the primary winding of the transformer (Block 1521). In operation, the switch is closed for a time just long enough for the current through the switch to complete a full cycle from zero to a peak value, back to zero, to a peak value in the opposite direction and back to zero (Block 1531). In addition, each of the voltage of the voltage source and the time between the repeated switch closures may be adjusted to achieve a desired waveform of a voltage of the plasma load (Block 1541). For example, as discussed above, the desired waveform may be a sheath voltage to achieve a narrow distribution of ion energies (e.g., as shown in FIG. 5A) or a broader distribution of ion energies (e.g., as shown in FIGS. 6A and 7A).

Referring to FIG. 16A, shown is an exemplary bias supply 1601 to apply a periodic voltage function to a capacitively coupled plasma load 1602 (which resides with a plasma chamber, e.g., plasma chamber 101). The output node 1604 of the bias supply 1601 connects to the input node 1605 of the plasma load 1602 and the return node 1606 of the bias supply 1601 connects to the return node 1607 of the plasma chamber 101. The return nodes 1606 and 1607 are frequently done through the chassis or enclosure of both the bias supply and the plasma load and since these are typically kept at ground potential it is also typically referred to as ground, chassis ground, or earth ground. As shown, the bias supply 1601 utilizes a DC supply 1603 as a voltage source in which the positive output terminal of the DC supply is connected to ground and in which the large inductor L2 is connected on the load side of the small inductor L1.

As shown, a first inductor, L1, is coupled between a first node 1670 of the switch, S, and the output node 1604, and a first node 1672 of a second inductor, L2, is coupled to the output node 1604. The voltage source is coupled between a second node 1674 of the switch, S, and a second node 1676 of the second inductor, L2. And a connection is made between the return node 1606 and the second node 1674 of the switch, S.

Referring to FIG. 16B, shown is an exemplary bias supply 1611 to apply a periodic voltage function to a capacitively coupled plasma load 1612. As shown, the bias supply 1611 utilizes a DC supply 1613 in which the negative output terminal of the DC supply 1613 is connected to ground and in which the large inductor $L_2$ is connected on the load side of the small inductor $L_1$. As shown, a first inductor, L1, is coupled between a first node 1670 of the switch, S, and the output node 1604, and a first node 1672 of a second inductor, L2, is coupled to the output node 1604. The voltage source is coupled between a second node 1674 of the switch, S, and a second node 1676 of the second inductor, L2, and a connection is made between the return node 1606 and the second node 1676 of the second inductor, L2.

Referring to FIG. 16C, shown is an exemplary bias supply 1621 to apply a periodic voltage function to a capacitively coupled plasma load 1622. As shown, the bias supply 1621 utilizes a DC supply 1623 in which the positive output terminal of the DC supply 1623 is connected to ground and in which the large inductor $L_2$ is connected on the switch side of the small inductor $L_1$. As shown, a first inductor, L1, is coupled between a first node 1670 of the switch, S, and the output node 1604. And a first node 1672 of a second inductor, L2, is coupled to the first node 1670 of the switch, S. The voltage source is coupled between a second node 1674 of the switch, S, and a second node 1676 of the second inductor, L2, and a connection is made between the return node 1606 and the second node 1674 of the switch, S.

Referring to FIG. 16D, shown is an exemplary bias supply 1631 to apply a periodic voltage function to a capacitively coupled plasma load 1632. As shown, the bias supply 1631 utilizes a DC supply 1633 in which the negative output terminal of the DC supply 1633 is connected to ground and in which the large inductor $L_2$ is connected on the switch side of the small inductor $L_1$. As shown, a first inductor, L1, is coupled between a first node 1670 of the switch, S, and the output node 1604. And a first node 1672 of a second inductor, L2, is coupled to the first node 1670 of the switch, S. The voltage source is coupled between a second node 1674 of the switch, S, and a second node 1676 of the second inductor, L2. As shown, a connection is made between the return node 1606 and the second node 1676 of the second inductor, L2.

Referring to FIG. 16E, shown is an exemplary bias supply 1641 to apply a periodic voltage function to a capacitively coupled plasma load 1642. As shown, the bias supply 1641 utilizes a DC supply 1643 (as a voltage source) in which the positive output terminal of the DC supply 1643 is connected to ground and in which a transformer 1644 is used to connect to the plasma load 1642. The transformer includes a primary winding (represented by $L_{LP}$ and $L_P$) and a secondary winding (represented by $L_S$ and $L_{LS}$). A first node 1680 of the primary winding of the transformer is coupled to a first node 1670 of the switch, S. A first node 1682 of the secondary winding of the transformer is coupled to the output node 1604. And a second node 1684 of the secondary winding of the transformer is coupled to the return node 1606. The DC supply 1643 (voltage source) is coupled between a second node 1674 of the switch, S, and a second node 1686 of the primary winding of the transformer.

Referring to FIG. 16F, shown is an exemplary bias supply 1651 to apply a periodic voltage function to a capacitively coupled plasma load 1652. As shown, the bias supply 1651 utilizes a DC supply 1653 as a voltage source in which the negative output terminal of the DC supply 1653 is connected to ground and in which a transformer 1654 is used to connect to the load. The bias supplies 1641, 1651 in both FIGS. 16E and 16F, include a transformer. And as shown, a first node of a primary winding of the transformer is coupled to a first node of the switch, a first node of a secondary winding of the transformer is coupled to the output node, and a second node of the secondary winding of the transformer is coupled to the return node. The transformer includes a primary winding (represented by $L_{LP}$ and $L_P$) and a secondary winding (represented by $L_S$ and $L_{LS}$). A first node 1680 of the primary winding of the transformer is coupled to a first node 1670 of the switch, S. A first node 1682 of the secondary winding of the transformer is coupled to the output node 1604. And a second node 1684 of the secondary winding of the transformer is coupled to the return node 1606. The DC supply 1643 (voltage source) is coupled between a second node 1674 of the switch, S, and a second node 1686 of the primary winding of the transformer. As shown, the second node 1686 of the primary winding of the transformer is configured to couple to the return node 1607.

Figure 17:
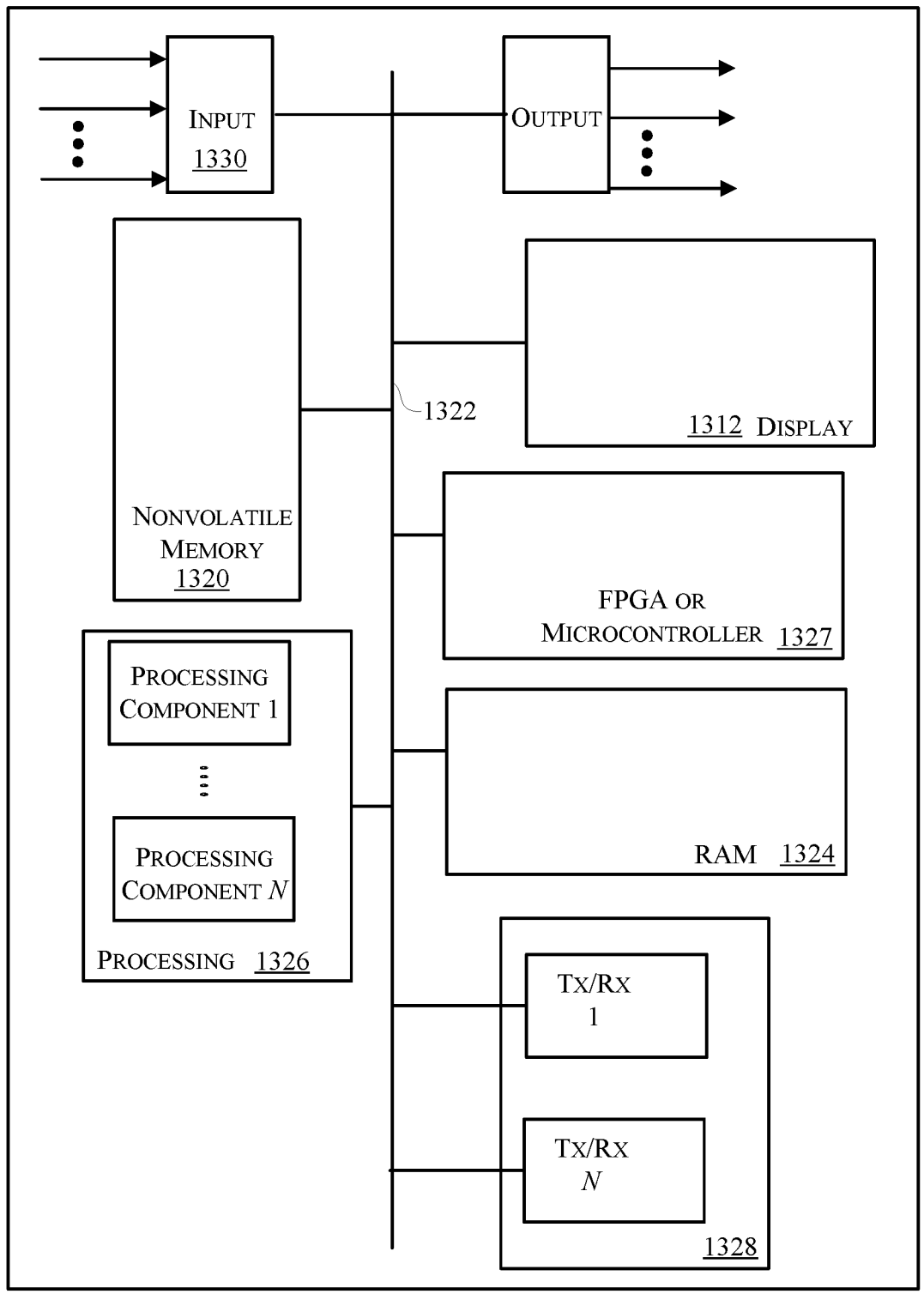
FIG. 17 is a block diagram depicting components that may be utilized to implement control aspects disclosed herein.

The methods described in connection with the embodiments disclosed herein may be embodied directly in hardware, in processor-executable code encoded in a non-transitory tangible processor readable storage medium, or in a combination of the two. Referring to FIG. 17 for example, shown is a block diagram depicting physical components that may be utilized to realize control aspects disclosed herein. As shown, in this embodiment a display 1312 and nonvolatile memory 1320 are coupled to a bus 1322 that is also coupled to random access memory ("RAM") 1324, a processing portion (which includes N processing components) 1326, a field programmable gate array (FPGA) 1327, and a transceiver component 1328 that includes N transceivers. Although the components depicted in FIG. 17 represent physical components, FIG. 17 is not intended to be a detailed hardware diagram; thus, many of the components depicted in FIG. 17 may be realized by common constructs or distributed among additional physical components. Moreover, it is contemplated that other existing and yet-to-be developed physical components and architectures may be utilized to implement the functional components described with reference to FIG. 17.

This display 1312 generally operates to provide a user interface for a user, and in several implementations, the display is realized by a touchscreen display. In general, the nonvolatile memory 1320 is non-transitory memory that functions to store (e.g., persistently store) data and processor-executable code (including executable code that is associated with effectuating the methods described herein). In some embodiments for example, the nonvolatile memory 1320 includes bootloader code, operating system code, file system code, and non-transitory processor-executable code to facilitate the execution of a method of biasing a substrate with the single controlled switch.

In many implementations, the nonvolatile memory 1320 is realized by flash memory (e.g., NAND or ONENAND memory), but it is contemplated that other memory types may be utilized as well. Although it may be possible to execute the code from the nonvolatile memory 1320, the executable code in the nonvolatile memory is typically loaded into RAM 1324 and executed by one or more of the N processing components in the processing portion 1326.

The N processing components in connection with RAM 1324 generally operate to execute the instructions stored in nonvolatile memory 1320 to enable execution of the algorithms and functions disclosed herein. It should be recognized that several algorithms are disclosed herein, but some of these algorithms are not represented in flowcharts. Processor-executable code to effectuate methods described herein may be persistently stored in nonvolatile memory 1320 and executed by the N processing components in connection with RAM 1324. As one of ordinarily skill in the art will appreciate, the processing portion 1326 may include a video processor, digital signal processor (DSP), microcontroller, graphics processing unit (GPU), or other hardware processing components or combinations of hardware and software processing components (e.g., an FPGA or an FPGA including digital logic processing portions).

In addition, or in the alternative, non-transitory FPGA-configuration-instructions may be persistently stored in nonvolatile memory 1320 and accessed (e.g., during boot up) to configure a field programmable gate array (FPGA) to implement the algorithms disclosed herein (e.g., including, but not limited to, the algorithms described with reference to FIGS. 15A and 15B).

The input component 1330 may receive signals (e.g., signals indicative of current and voltage obtained at the output of the disclosed bias supplies). In addition, the input component 1330 may receive phase information and/or a synchronization signal between bias supplies 108 and source generator 112 that are indicative of one or more aspects of an environment within a plasma processing chamber 101 and/or synchronized control between a source generator and the single switch bias supply. The signals received at the input component may include, for example, synchronization signals, power control signals to the various generators and power supply units, or control signals from a user interface. Those of ordinary skill in the art will readily appreciate that any of a variety of types of sensors such as, without limitation, directional couplers and voltage-current (VI) sensors, may be used to sample power parameters, such as voltage and current, and that the signals indicative of the power parameters may be generated in the analog domain and converted to the digital domain.

The output component generally operates to provide one or more analog or digital signals to effectuate the opening and closing of the switch and control of the voltage sources described herein.

The depicted transceiver component 1328 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

As used herein, the recitation of "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A bias supply to apply a periodic voltage comprising:
   an output node;
   a return node;
   a switch;
   a first inductor coupled between a first node of the switch and the output node;
   a first node of a second inductor coupled to one of the output node or the first node of the switch;
   a voltage source coupled between a second node of the switch and a second node of the second inductor;
   a connection between the return node and one of the second node of the switch and the second node of the second inductor; and
   a controller configured to cause an application of the periodic voltage between the output node and the return node by repeatedly closing the switch for a time just long enough for current through the switch to complete a full cycle from zero to a peak value, back to zero, to a peak value in an opposite direction and back to zero.

2. The bias supply of claim 1, wherein the controller is configured to adjust a voltage of the voltage source and a time between the repeated switch closures to achieve a desired periodic voltage.

3. The bias supply of claim 1, wherein the controller includes at least one of a processor or a field programmable gate array and the controller includes non-transitory computer-readable medium comprising instructions stored thereon, for execution by the processor, or for configuring the field programmable gate array, to control operation of the switch.

* * * * *